US012706171B2

(12) United States Patent
Kim et al.

(10) Patent No.: US 12,706,171 B2
(45) Date of Patent: Aug. 11, 2026

(54) MEMORY DEVICE INCLUDING DAMAGE DETECTION CIRCUIT AND TEST SYSTEM INCLUDING THE MEMORY DEVICE

(71) Applicant: SAMSUNG ELECTRONICS CO., LTD., Suwon-si (KR)

(72) Inventors: Eunji Kim, Suwon-si (KR); Wandong Kim, Suwon-si (KR); Byongmo Moon, Suwon-si (KR); Kwangjin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 158 days.

(21) Appl. No.: 18/830,032

(22) Filed: Sep. 10, 2024

(65) Prior Publication Data

US 2025/0201324 A1 Jun. 19, 2025

(30) Foreign Application Priority Data

Dec. 19, 2023 (KR) ........................ 10-2023-0186148

(51) Int. Cl.
*G11C 29/10* (2006.01)

(52) U.S. Cl.
CPC .................................... *G11C 29/10* (2013.01)

(58) Field of Classification Search
CPC ...................................................... G11C 29/10
See application file for complete search history.

(56) References Cited

U.S. PATENT DOCUMENTS 6,449,748 B1 * 9/2002 Jeng .................... G01R 31/3187 257/E21.53
6,649,986 B1 * 11/2003 Ishizaki ................ H10P 74/277 257/414
9,847,301 B2 12/2017 Minami et al.
10,613,155 B2 4/2020 Wu et al.
11,521,904 B2 12/2022 Lin et al.
2006/0087021 A1 * 4/2006 Hirose .................. H10P 74/273 257/E23.079
2012/0032693 A1 2/2012 Xue et al.
2022/0349935 A1 11/2022 Fayneh et al.

FOREIGN PATENT DOCUMENTS

JP 4728628 B2 7/2011
JP 5370250 B2 12/2013
JP 5861822 B2 2/2016
JP 6444914 B2 12/2018
JP 2022-183734 A 12/2022
KR 10-1738928 B1 5/2017

* cited by examiner

*Primary Examiner* — Stephanie E Bloss
*Assistant Examiner* — Michael A Harrison
(74) *Attorney, Agent, or Firm* — Sughrue Mion, PLLC

(57) ABSTRACT

A memory device includes a memory cell array region including a plurality of memory cells, a first test pattern form disposed below a bonding pad and configured to output a first test output signal, a second test pattern form disposed below a non-bonding pad and configured to output a second test output signal, and a damage detection circuit. The damage detection circuit is configured to output a test result signal indicating whether a lower region of the bonding pad has been damaged. The test result signal is based on the number of times a logic level of the first test output signal transitions and the number of times a logic level of the second test output signal transitions.

20 Claims, 15 Drawing Sheets

Figure 11:
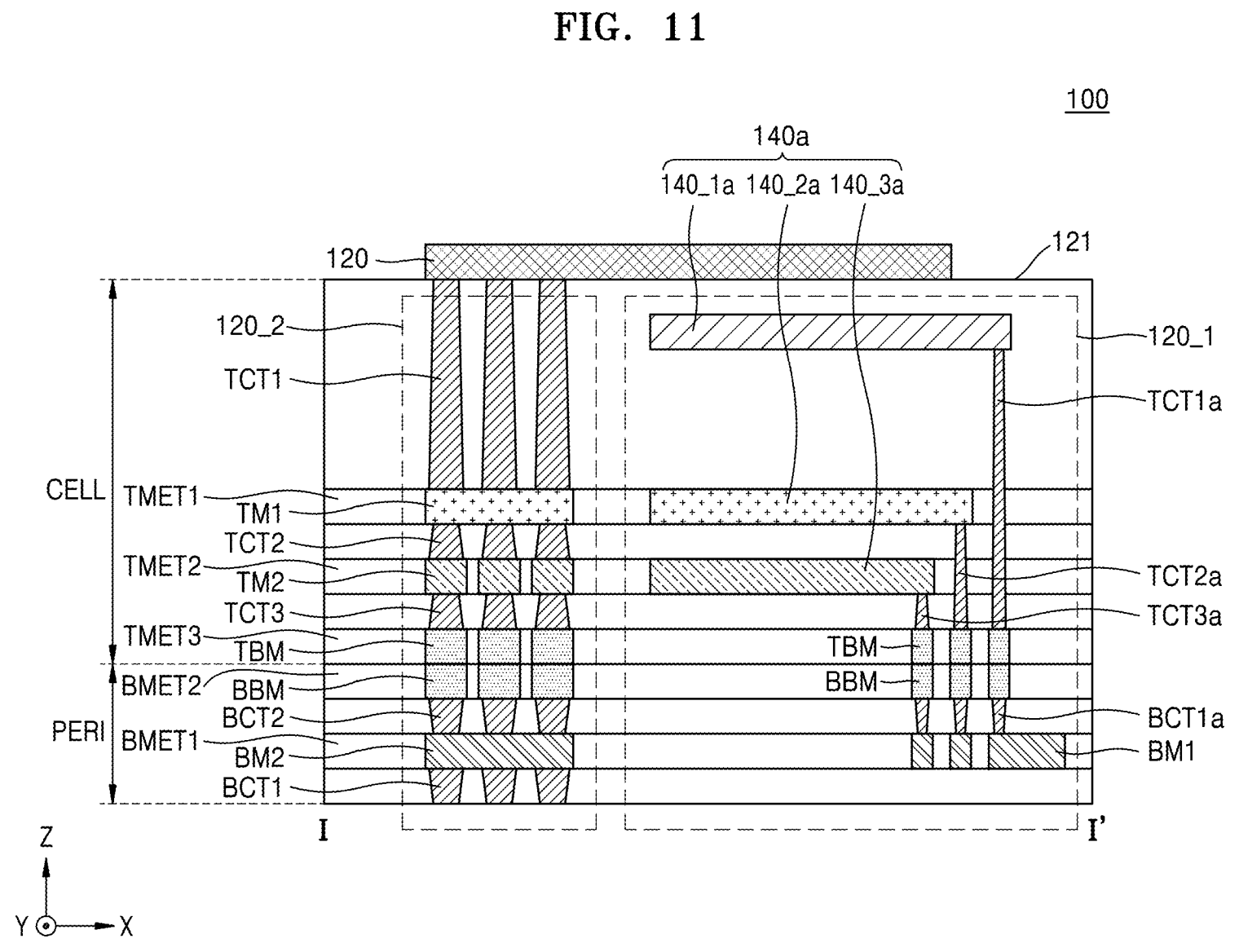

100
120_1
TCT1a
TCT2a
TCT3a
BCT1a
BM1
121
140a
140_1a 140_2a 140_3a
TBM
BBM
I'
120
I
120_2
TCT1
TM1
TCT2
TM2
TCT3
TBM
BBM
BCT2
BM2
BCT1
TMET1
TMET2
TMET3
BMET2
BMET1
CELL
PERI
Z
Y
X

Figure 12:
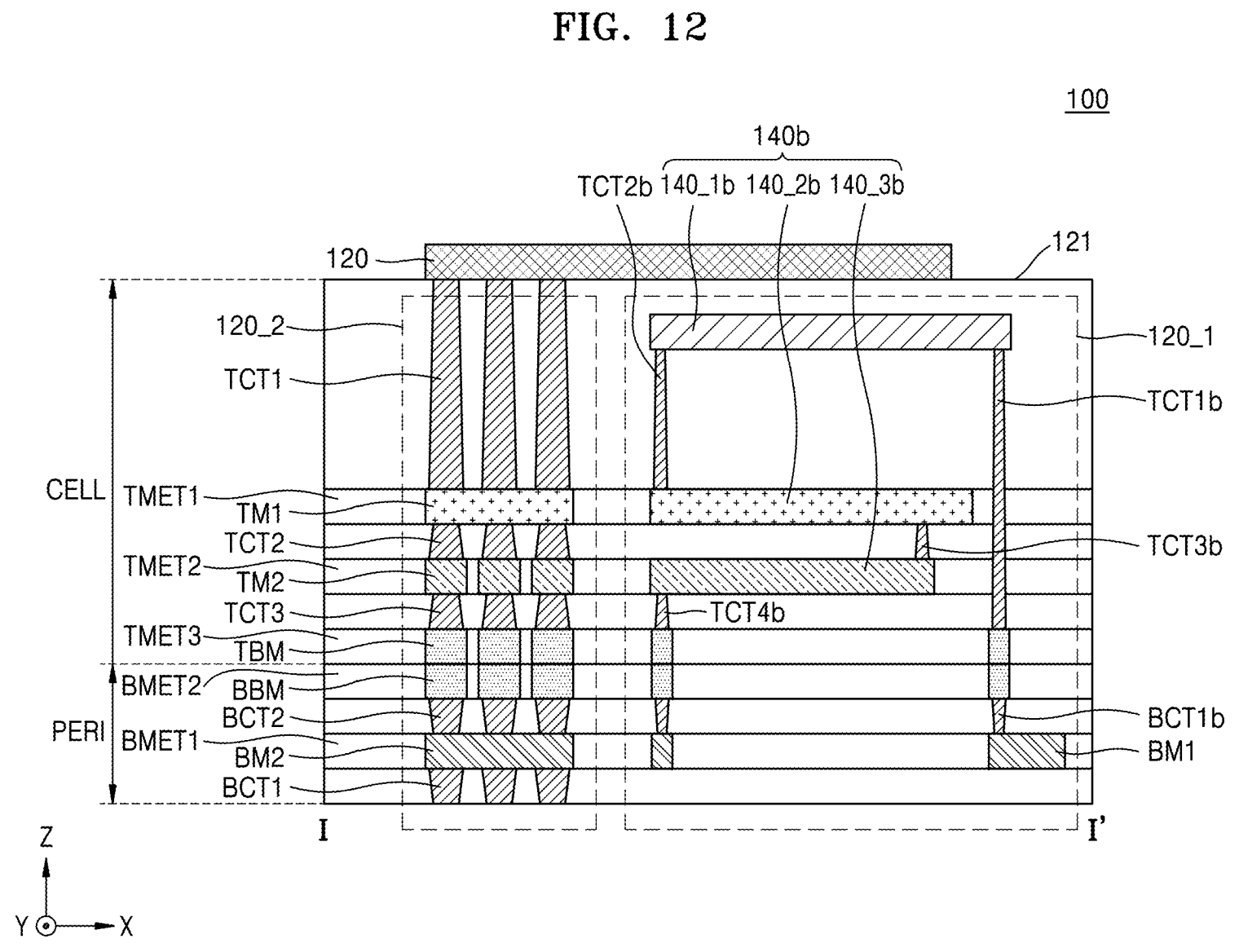

120_1 TCT1b TCT3b BCT1b BM1 121 TCT4b TCT2b I'

120 120_2 TCT1 TM1 TCT2 TM2 TCT3 TBM BBM BCT2 BM2 BCT1 I

TMET1 TMET2 TMET3 BMET2 BMET1

CELL PERI

Figure 13:
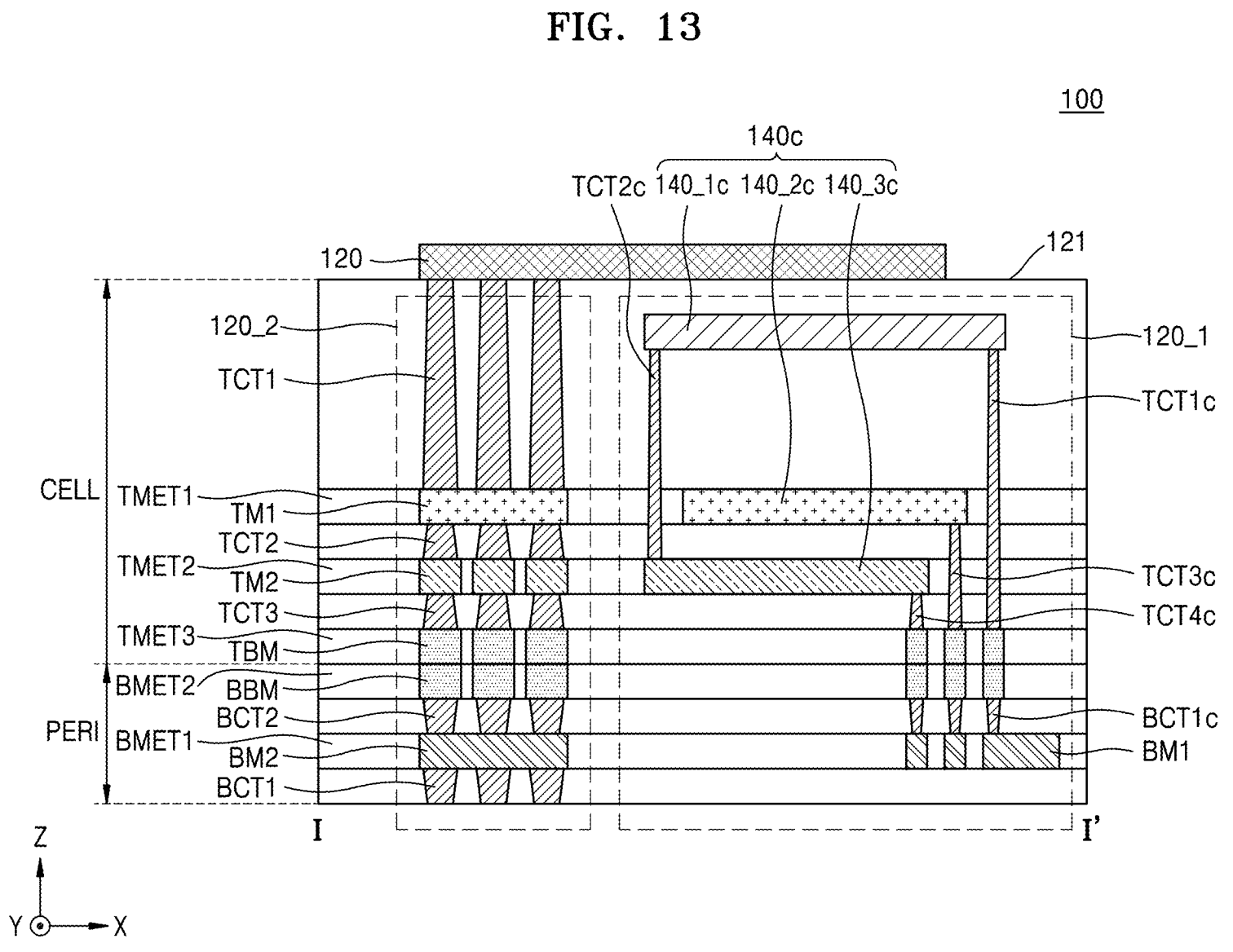

120_1
TCT1c
TCT3c
TCT4c
BCT1c
BM1
121
140c
140_1c 140_2c 140_3c
TCT2c
I'
I
120
120_2
TCT1
TM1
TCT2
TM2
TCT3
TBM
BBM
BCT2
BM2
BCT1
TMET1
TMET2
TMET3
BMET2
BMET1
CELL
PERI
Z
Y
X

MEMORY DEVICE INCLUDING DAMAGE DETECTION CIRCUIT AND TEST SYSTEM INCLUDING THE MEMORY DEVICE

CROSS-REFERENCE TO RELATED APPLICATION

This application is based on and claims priority under 35 U.S.C. § 119 to Korean Patent Application No. 10-2023-0186148, filed on Dec. 19, 2023, in the Korean Intellectual Property Office, the disclosure of which is incorporated by reference herein in its entirety.

BACKGROUND

The present disclosure relates to a memory device including a damage detection circuit and a test system including the memory device, and more particularly, to a memory device that uses a damage detection circuit to test whether a lower region of a pad in the memory device has been damaged and outputs a test result.

To connect a memory device to an external device, a pad of the memory device may be electrically connected to the external device through wire bonding. In addition, the memory device may be tested through automated test equipment (ATE). For example, the memory device may be tested by bringing a probe of the ATE into contact with the pad of the memory device. At this time, the lower region of the pad of the memory device may be damaged due to external force generated in the process of performing wire bonding between the pad of the memory device and the external device or bringing the probe of the test equipment into contact with the pad of the memory device. Since damage to the lower region of the pad of the memory device may reduce yield and quality in producing memory devices, there is a need for a method of detecting damage to the lower region of the pad of the memory device at an early stage.

SUMMARY

One or more embodiments provide a method of detecting damage to a lower region of a pad of a memory device at an early stage.

The aspects of the disclosure are not limited to the above aspect, and other aspects that are not mentioned herein will be clearly understood by those of ordinary skill in the art from the following description.

According to an aspect of the disclosure, a memory device includes: a memory cell array region including a plurality of memory cells; a plurality of bonding pads partially overlapping the memory cell array region in a vertical direction, the plurality of bonding pads including a bonding pad configured to electrically connect the memory device to an external device and a non-bonding pad configured to be electrically connected to an internal circuit of the memory device; a first test pattern form below the bonding pad and configured to output a first test output signal based on a test input signal; a second test pattern form below the non-bonding pad and configured to output a second test output signal based on the test input signal; and a damage detection circuit configured to output a test result signal indicating whether a lower region of the bonding pad has been damaged, based on a first number of logic level transitions of the first test output signal and a second number of logic level transitions of the second test output signal.

According to an aspect of the disclosure, a memory device includes: a memory cell array region including a plurality of memory cells; a plurality of bonding pads partially overlapping the memory cell array region in a vertical direction, the plurality of bonding pads including a bonding pad configured to electrically connect the memory device to an external device and a non-bonding pad configured to be electrically connected to an internal circuit of the memory device; a first test pattern form disposed below the bonding pad and configured to output a first test output signal based on a test input signal; a second test pattern form disposed below the non-bonding pad and configured to output a second test output signal based on the test input signal; and a damage detection circuit configured to output a test result signal indicating whether a lower region of the bonding pad has been damaged, based on comparing a first delay time of the first test output signal with a second delay time of the second test output signal.

According to an aspect of the disclosure, a test system includes: a memory device; and a test device configured to provide a test input signal to the memory device, wherein the memory device is configured to provide, to the test device, a test result signal generated based on the test input signal, and the memory device includes: a memory cell array region including a plurality of memory cells; a plurality of bonding pads partially overlapping the memory cell array region in a vertical direction, the plurality of bonding pads including a bonding pad configured to electrically connect the memory device to an external device and a non-bonding pad configured to be electrically connected to an internal circuit of the memory device; a first test pattern form disposed below the bonding pad and configured to output a first test output signal based on the test input signal; a second test pattern form disposed below the non-bonding pad and configured to output a second test output signal based on the test input signal; and a damage detection circuit configured to output the test result signal indicating whether a lower region of the bonding pad has been damaged, based on a first number of logic level transitions of the first test output signal and a second number of logic level transitions of the second test output signal.

BRIEF DESCRIPTION OF THE DRAWINGS

Embodiments will be more clearly understood from the following detailed description taken in conjunction with the accompanying drawings, in which:

FIG. 3 is a block diagram illustrating a memory device according to an embodiment;

FIG. 4 is a block diagram illustrating a memory device according to an embodiment;

FIG. 7 is a block diagram illustrating a memory device according to an embodiment;

FIG. 8 is a block diagram illustrating a memory device according to an embodiment;

FIG. 11 is a cross-sectional view illustrating a memory device according to an embodiment;

FIG. 12 is a cross-sectional view illustrating a memory device according to an embodiment;

FIG. 13 is a cross-sectional view illustrating a memory device according to an embodiment;

DETAILED DESCRIPTION

Figure 1:
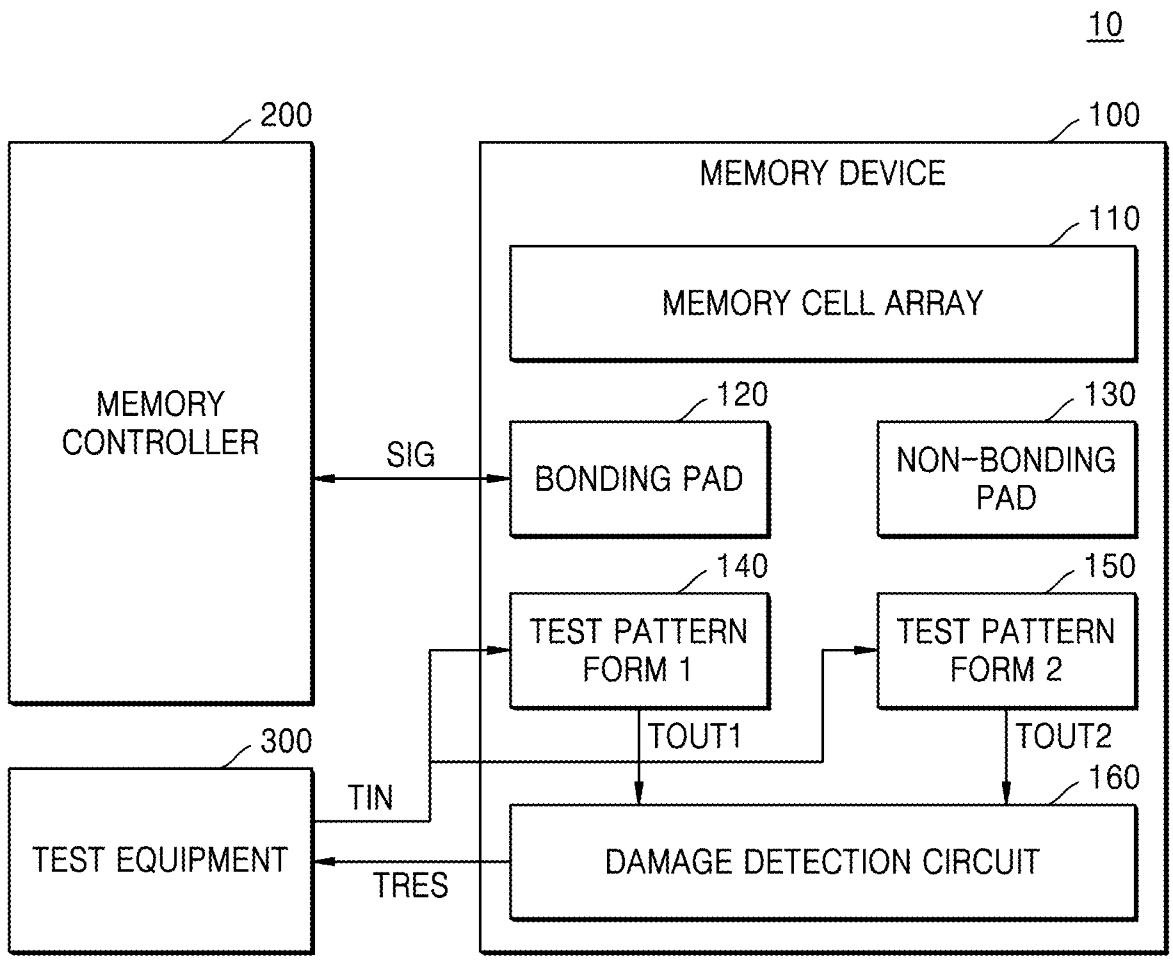
FIG. 1 is a block diagram illustrating a test system according to an embodiment.

Hereinafter, example embodiments will be described in detail with reference to the accompanying drawings. When describing embodiments with reference to the accompanying drawings, the same or corresponding elements are denoted by the same reference numerals, and redundant descriptions thereof are omitted.

FIG. 1 is a block diagram illustrating a test system 10 according to an embodiment.

Referring to FIG. 1, the test system 10 may include a memory device 100, a memory controller 200, and test equipment 300.

The memory device 100 may include a memory cell array 110, a bonding pad 120, a non-bonding pad 130, a first test pattern form 140, a second test pattern form 150, and a damage detection circuit 160.

In an embodiment, the memory device 100 may include a non-volatile memory device, such as flash memory. In some embodiments, the memory device 100 may be embedded in an electronic device or may be detachably attached thereto. For example, the memory device 100 may be implemented in various forms, such as an embedded universal flash storage (UFS) memory, an embedded multimedia card (eMMC), a solid state drive (SSD), a UFS memory card, a compact flash (CF) memory, a secure digital (SD) memory, a micro-SD memory, a mini-SD memory, an extreme digital (xD) memory, or a memory stick.

In an embodiment, the memory device 100 may have a cell-over-periphery (COP) structure. For example, the memory device 100 may include a first semiconductor layer and a second semiconductor layer. The first semiconductor layer may include the memory cell array 110 and the second semiconductor layer may include peripheral circuits. The second semiconductor layer may be disposed below the first semiconductor layer in a vertical direction, and accordingly, the second semiconductor layer may be disposed close to a substrate.

In an embodiment, the memory device 100 may have a chip-to-chip (C2C) structure. The C2C structure may refer to a structure formed by manufacturing at least one upper chip including a cell region (e.g., the memory cell array 110) and a lower chip including a peripheral circuit region and then bonding the at least one upper chip and the lower chip to each other. The C2C structure is described in detail below with reference to FIG. 14.

The memory cell array 110 may include a plurality of memory cells. For example, each of the memory cells may be a flash memory cell. Hereinafter, embodiments are described in detail on the assumption that each of the memory cells is a NAND flash memory cell. However, embodiments of the disclosure are not limited thereto, and in some embodiments, the memory cells may be resistive memory cells, such as resistive random access memory (RAM) (RRAM), phase change RAM (PRAM), ferroelectric RAM (FRAM), or magnetic RAM (MRAM).

The bonding pad 120 may be a pad configured to electrically connect the memory device 100 to an external device. The bonding pad 120 may be disposed above the memory cell array 110 in a direction perpendicular to the memory cell array 110, and a detailed description thereof is given below with reference to FIG. 2.

In an embodiment, the external device may be, for example, the memory controller 200 illustrated in FIG. 1. The memory device 100 may communicate with the memory controller 200 by exchanging a signal SIG with the memory controller 200 through the bonding pad 120. The memory controller 200 may be wire-bonded to the memory device 100 through the bonding pad 120 and may communicate with the memory device 100 by exchanging the signal SIG with the memory device 100. The signal SIG that is exchanged between the memory device 100 and the memory controller 200 may include a command signal, an address signal, a data signal, and the like.

In addition, for example, the external device that is electrically connected to the memory device 100 may be the test equipment 300. In the present specification, the test equipment 300 may refer to automated test equipment (ATE) that tests the memory device 100. A probe of the test equipment 300 may come into contact with the bonding pad 120, and the test equipment 300 may test the memory device 100. At this time, the signal SIG the test equipment 300 provides to the memory device 100 through the bonding pad 120 may be different from a test input signal TIN that is provided to the memory device 100 through the first test pattern form 140 and the second test pattern form 150.

Although FIG. 1 illustrates that the memory device 100 includes only one bonding pad 120, this is only an example and the memory device 100 may include two or more bonding pads.

The non-bonding pad 130 may be a pad that is not electrically connected to the external device. The non-bonding pad 130 may be a pad used as a criterion for determining whether the lower region of the bonding pad 120 has been damaged. The non-bonding pad 130 may be disposed above the memory cell array 110 in a direction perpendicular to the memory cell array 110. A detailed description thereof is given below with reference to FIG. 2.

In an embodiment, external force may be applied to the bonding pad 120 of the memory device 100 in a process of electrically connecting the bonding pad 120 to the external device through wire bonding, or bring the probe of the test equipment 300 into contact with the bonding pad 120. Due to the external force, the lower region of the bonding pad 120 may be damaged. However, since the non-bonding pad 130 is not electrically connected to the external device, the lower region of the non-bonding pad 130 may not be damaged. When the lower region of the bonding pad 120 is damaged, the signal output from the first test pattern form 140 may be different from the signal output from the second test pattern form 150. Therefore, the signal output from the second test pattern form 150 disposed below the non-bonding pad 130 may be a reference value for determining whether the lower region of the bonding pad 120 has been damaged.

Although FIG. 1 illustrates that the memory device 100 includes only one non-bonding pad 130, this is only an example and the memory device 100 may include two or more non-bonding pads.

The first test pattern form 140 may receive a test input signal TIN from the test equipment 300. The first test pattern form 140 may output a first test output signal TOUT1 in response to the test input signal TIN. The first test pattern form 140 may be disposed below the bonding pad 120 in a vertical direction. In an example, the bonding pad is disposed above the memory cell array region, and at least a portion of the bonding pad is configured to overlap at least a portion of the memory cell array region in the vertical direction. A detailed description thereof is given below with reference to FIG. 3.

The first test output signal TOUT1 may be different from a second test output signal TOUT2 according to whether the lower region of the bonding pad 120 has been damaged. A detailed description thereof is given below with reference to FIGS. 5 and 6.

The second test pattern form 150 may receive the test input signal TIN from the test equipment 300. The second test pattern form 150 may output the second test output signal TOUT2 in response to the test input signal TIN. The second test pattern form 150 may be disposed below the non-bonding pad 130 in a vertical direction. In an example, at least a portion of the non-bonding pad is configured to overlap at least a portion of the memory cell array region in the vertical direction. A detailed description thereof is given below with reference to FIG. 3.

In an embodiment, the test input signal TIN applied to the first test pattern form 140 may be identical to the test input signal TIN applied to the second test pattern form 150.

In an embodiment, each of the first test pattern form 140 and the second test pattern form 150 may be formed of at least one of various conductive materials. For example, each of the first test pattern form 140 and the second test pattern form 150 may be formed of tungsten, copper, aluminum, or the like.

The damage detection circuit 160 may receive the first test output signal TOUT1 from the first test pattern form 140 and the second test output signal TOUT2 from the second test pattern form 150. The damage detection circuit 160 may generate a test result signal TRES based on the result of comparing the first test output signal TOUT1 with the second test output signal TOUT2. The test result signal TRES may include a value indicating whether the lower region of the bonding pad 120 has been damaged. For example, when the lower region of the bonding pad 120 has not been damaged, the test result signal TRES may include a first value indicating that the lower region of the bonding pad 120 is normal. Alternatively, when the lower region of the bonding pad 120 has been damaged, the test result signal TRES may include a second value indicating that the lower region of the bonding pad 120 has been damaged. The damage detection circuit 160 may provide the test result signal TRES to the test equipment 300.

In an embodiment, the damage detection circuit 160 may include a counter. The damage detection circuit 160 may count the number of times the logic levels of the first test output signal TOUT1 and the second test output signal TOUT2 transition. For example, the damage detection circuit 160 may output the test result signal TRES indicating whether a lower region of the bonding pad has been damaged, based on a first number of logic level transitions of the first test output signal and a second number of logic level transitions of the second test output signal. The damage detection circuit may generate the test result signal TRES based on the result of comparing a count value corresponding to the first test output signal TOUT1 with a count value corresponding to the second test output signal TOUT2. A detailed description thereof is given below with reference to FIGS. 3 to 6.

In an embodiment, the damage detection circuit 160 may include a time-to-digital conversion circuit. The damage detection circuit 160 may generate the test result signal TRES based on the result of comparing a delay time of the first test output signal TOUT1 with a delay time of the second test output signal TOUT2. A detailed description thereof is given below with reference to FIGS. 7 to 10. In an example, the damage detection circuit is configured to output a test result signal indicating whether a lower region of the bonding pad has been damaged, based on comparing the first delay time TOUT1 of the first test output signal with the second delay time TOUT2 of the second test output signal.

The memory device 100 according to an embodiment may determine whether the lower region of the bonding pad 120 has been damaged. In addition, the memory device 100 according to an embodiment may detect even fine damage to the lower region of the bonding pad 120 by comparing the first test output signal TOUT1 output from the first test pattern form 140 disposed in the lower region of the bonding pad 120 with the second test output signal TOUT2 output from the second test pattern form 150 disposed in the lower region of the non-bonding pad 130.

Figure 2:
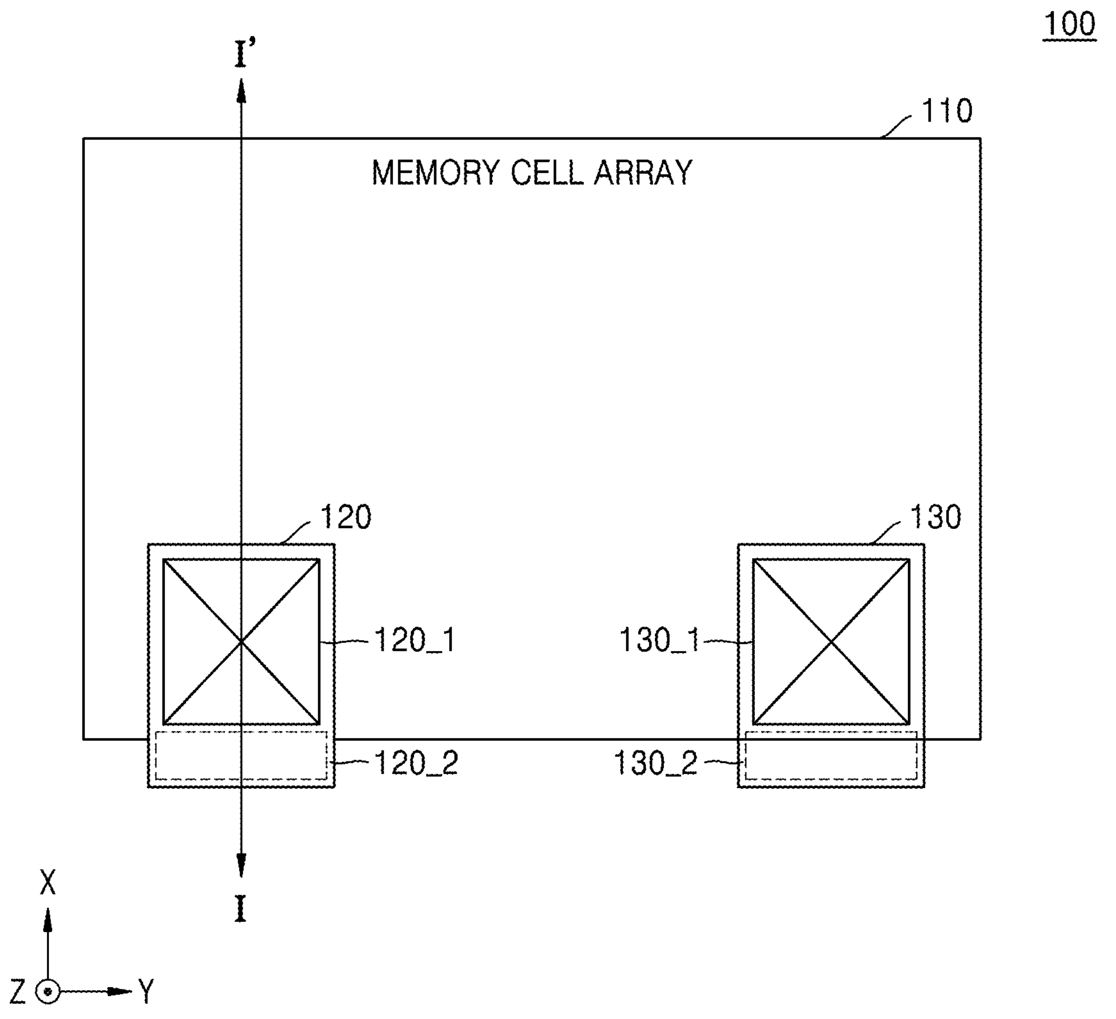
FIG. 2 is a block diagram illustrating a memory device according to an embodiment.

FIG. 2 is a block diagram illustrating the memory device 100 according to an embodiment. FIG. 2 may be described with reference to FIG. 1, and redundant descriptions may be omitted.

FIG. 2 illustrates a plan view of the memory device 100 in a vertical direction. In the present specification, unless specifically defined herein, the vertical direction may be referred to as a first direction or a Z direction. In addition, a direction perpendicular to the first direction may be referred to as a second direction or a Y direction. In addition, a direction perpendicular to the first direction and the second direction may be referred to as a third direction or an X direction. For convenience of understanding, those described as top/bottom surfaces, upper/lower portions, above/below, etc. are denoted based on the directions illustrated in the reference drawings. Accordingly, even the same surface may be referred to as a top surface and a bottom surface according to the directions illustrated in the drawings.

Referring to FIG. 2, the bonding pad 120 and the non-bonding pad 130 may be disposed above the memory cell array 110 in the vertical direction.

The lower region of the bonding pad 120 may be divided into a first region 120_1 and a second region 120_2. In the present specification, the first region 120_1 may refer to a region where the memory cell array 110 and the bonding pad 120 overlap each other in the vertical direction. In some embodiments, the first region 120_1 may be referred to as a cell region, a memory cell region, or a memory cell array region. The second region 120_2 may refer to a region where the memory cell array 110 and the bonding pad 120 do not overlap each other in the vertical direction. In some embodiments, the second region 120_2 may be referred to as a connection region.

The memory device 100 may detect damage to the first region 120_1 through the first test output signal TOUT1 output from the first test pattern form 140, which is a metal pattern disposed in the first region 120_1 at the lower portion of the bonding pad 120. A specific embodiment of detecting damage to the first region 120_1 is described below with reference to FIG. 3.

The second region 120_2 may refer to a region including a plurality of contacts for providing an electrical connection between the bonding pad 120 and the peripheral circuit included in the memory device 100.

At least a portion of the bonding pad 120 may overlap at least a portion of the memory cell array 110 in the first direction Z. The remaining portion of the bonding pad 120 may not overlap the memory cell array 110 in the first direction Z. For example, the first region 120_1 below the bonding pad 120 may overlap the memory cell array 110 in the first direction Z. In addition, for example, the second region 120_2 below the bonding pad 120 may not overlap the memory cell array 110 in the first direction Z.

The lower region of the non-bonding pad 130 may be divided into a memory cell region 130_1 and a connection region 130_2.

The memory device 100 may generate the test result signal TRES by comparing the second test output signal TOUT2 output from the second test pattern form 150, which is the metal pattern disposed in the memory cell region 130_1 of the non-bonding pad 130, with the first test output signal TOUT1, and the test result signal TRES may be used as a reference value for determining whether the first region 120_1 of the bonding pad 120 has been damaged.

The connection region 130_2 may refer to a region including a plurality of contacts for providing an electrical connection between the non-bonding pad 130 and the peripheral circuit included in the memory device 100.

At least a portion of the non-bonding pad 130 may overlap at least a portion of the memory cell array 110 in the first direction Z. The remaining portion of the non-bonding pad 130 may not overlap the memory cell array 110 in the first direction Z. For example, the memory cell region 130_1 below the non-bonding pad 130 may overlap the memory cell array 110 in the first direction Z. In addition, for example, the connection region 130_2 below the non-bonding pad 130 may not overlap the memory cell array 110 in the first direction Z.

The non-bonding pad 130 may be apart from the bonding pad 120 in the second direction.

Figure 3:
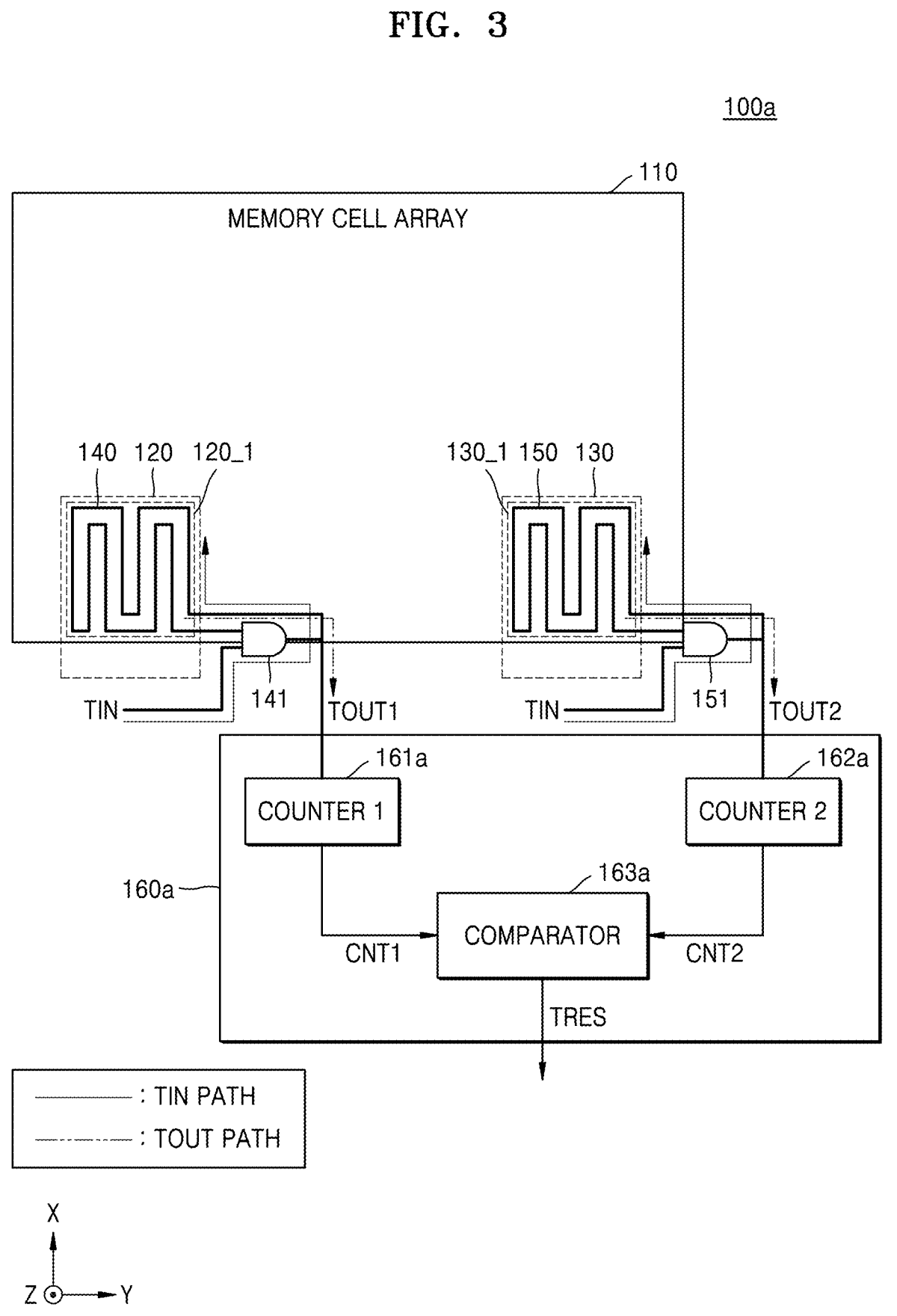

FIG. 3 is a block diagram illustrating a memory device 100*a* according to an embodiment. FIG. 3 may be described with reference to FIGS. 1 and 2, and redundant descriptions may be omitted.

The memory device 100*a* of FIG. 3 may correspond to the memory device 100 of FIG. 1. Specifically, FIG. 3 may be a plan view of the first test pattern form 140 disposed below the bonding pad 120 and the second test pattern form 150 disposed below the non-bonding pad 130 in FIG. 2.

Referring to FIG. 3, the memory device 100*a* may include a memory cell array 110, a bonding pad 120, a non-bonding pad 130, a first test pattern form 140, a first NAND gate 141, a second test pattern form 150, a second NAND gate 151, and a damage detection circuit 160*a*.

The first test pattern form 140 may be disposed below the bonding pad 120. Specifically, the first test pattern form 140 may be disposed in a first region 120_1 in a lower region of the bonding pad 120.

The test equipment 300 may provide a test input signal TIN to the first test pattern form 140 through the first NAND gate 141. The test input signal TIN may pass through the first test pattern form 140 and may then be output through the first NAND gate 141 as a first test output signal TOUT1. That is, the first test pattern form 140 may provide the first test output signal TOUT1 to the damage detection circuit 160*a*.

The second test pattern form 150 may be disposed below the non-bonding pad 130. Specifically, the second test pattern form 150 may be disposed in a memory cell region 130_1 in a lower region of the non-bonding pad 130.

The test equipment 300 may provide the test input signal TIN to the second test pattern form 150 through the second NAND gate 151. The test input signal TIN may pass through the second test pattern form 150 and may then be output through the second NAND gate 151 as a second test output signal TOUT2. That is, the second test pattern form 150 may provide the second test output signal TOUT2 to the damage detection circuit 160*a*. The second test output signal TOUT2 may be a comparison criterion when a comparator 163*a* performs a comparison operation with the first test output signal TOUT1.

The damage detection circuit 160*a* may include a first counter 161*a*, a second counter 162*a*, and the comparator 163*a*.

The first counter 161*a* may receive the first test output signal TOUT1 from the first test pattern form 140. The first counter 161*a* may output a first count value CNT1 generated by counting the number of times the logic level of the first test output signal TOUT1 transitions during a first time period. For example, the first counter 161*a* may output the first count value CNT1 corresponding to transitions of the first test output signal from a high level to a low level during a first reference time period. In some embodiments, the first count value CNT1 may be a value composed of N bits (where N is a natural number greater than or equal to 1).

For example, the first counter 161*a* may count the number of times the logic level of the first test output signal TOUT1 transitions from a high level to a low level during the first time period. In addition, for example, the first counter 161*a* may count the number of times the logic level of the first test output signal TOUT1 transitions from a low level to a high level during the first time period.

The number of times the logic level of the first test output signal TOUT1 transitions may vary depending on whether the first region 120_1, where the first test pattern form 140 is located, has been damaged. A detailed description thereof is given below with reference to FIG. 5.

The second counter 162*a* may receive the second test output signal TOUT2 from the second test pattern form 150. The second counter 162*a* may output a second count value CNT2 generated by counting the number of times the logic level of the second test output signal TOUT2 transitions during the first time period. In some embodiments, the second count value CNT2 may be a value composed of N bits (where N is a natural number greater than or equal to 2).

For example, the second counter 162*a* may count the number of times the logic level of the second test output signal TOUT2 transitions from a high level to a low level during the first time period. In addition, for example, the second counter 162*a* may count the number of times the logic level of the second test output signal TOUT2 transitions from a low level to a high level during the first time period.

The comparator 163*a* may receive the first count value CNT1 from the first counter 161*a* and the second count value CNT2 from the second counter 162*a*. The comparator 163*a* may output a test result signal TRES based on the result of comparing the first count value CNT1 with the second count value CNT2. Specifically, the comparator 163*a* may generate the test result signal TRES indicating whether the lower region of the bonding pad 120 has been damaged, based on the degree of the difference between the first count value CNT1 and the second count value CNT2. A detailed description thereof is given below with reference to FIG. 6.

Figure 4:
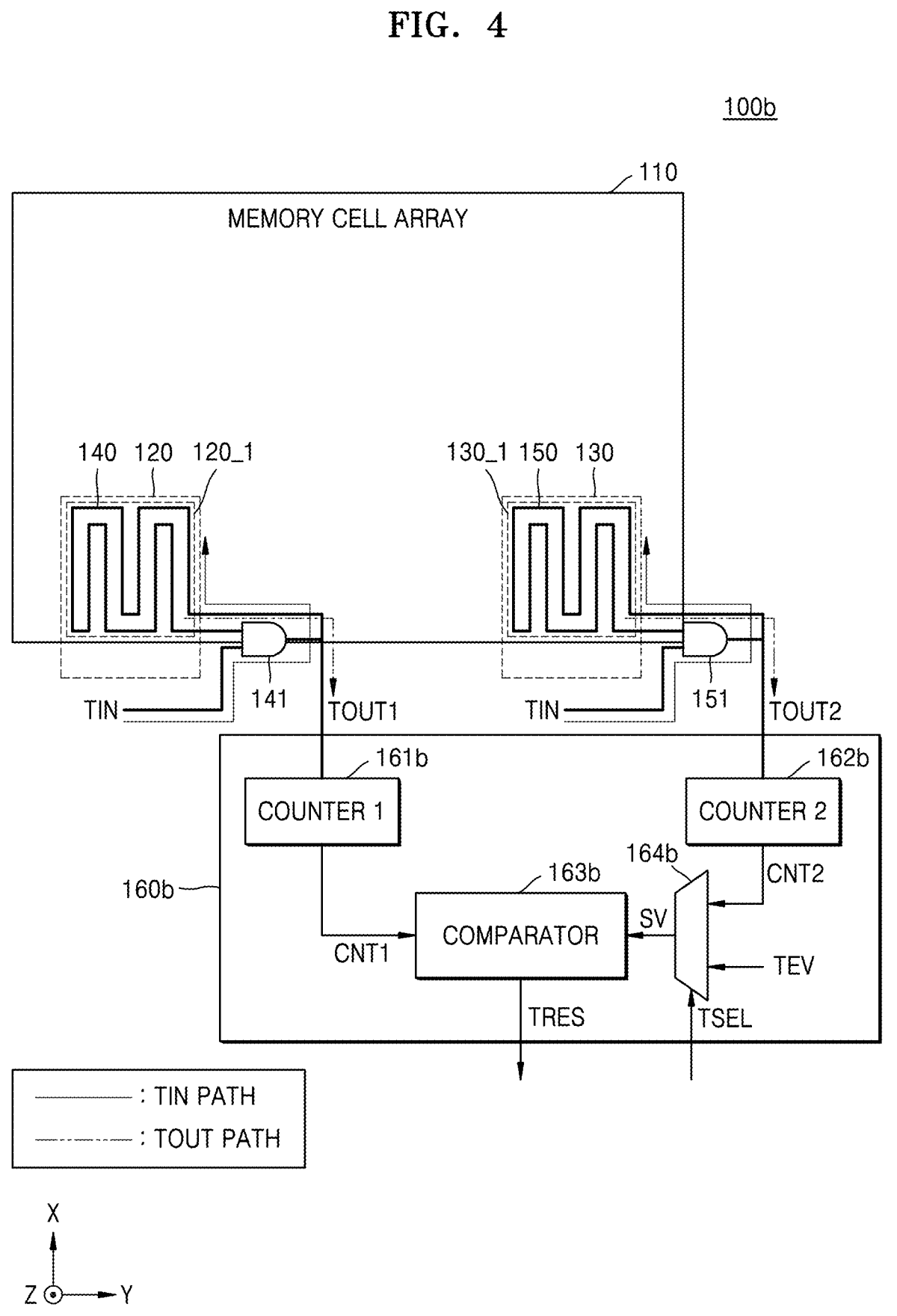

FIG. 4 is a block diagram illustrating a memory device 100*b* according to an embodiment. Specifically, a damage detection circuit 160*b* of FIG. 4 may further include a multiplexer 164*b*, compared to the damage detection circuit 160*a* of FIG. 3. FIG. 4 may be described with reference to FIGS. 1 to 3, and redundant descriptions may be omitted. In FIG. 4, the differences from the memory device 100*a* of FIG. 3 are mainly described.

Referring to FIG. 4, the memory device 100*b* of FIG. 4 may correspond to the memory device 100 of FIG. 1 and the memory device 100*a* of FIG. 3. The memory device 100*b* may include a memory cell array 110, a bonding pad 120, a non-bonding pad 130, a first test pattern form 140, a first NAND gate 141, a second test pattern form 150, a second NAND gate 151, and a damage detection circuit 160*b*.

The damage detection circuit 160*b* may include a first counter 161*b*, a second counter 162*b*, a comparator 163*b*, and the multiplexer 164*b*. The first counter 161*b* may correspond to the first counter 161*a* of FIG. 3 and the second counter 162*b* may correspond to the second counter 162*a* of FIG. 3.

The multiplexer 164*b* may receive a second count value CNT2 from the second counter 162*b*. In addition, the multiplexer 164*b* may receive a test expectation value TEV from the outside. In some embodiments, the test expectation value TEV may be a value previously input to the memory device 100*b* or an external value input by the test equipment 300. The test expectation value TEV may be different from the second count value CNT2.

The multiplexer 164*b* may select one of the second count value CNT2 and the test expectation value TEV based on a selection signal TSEL. The multiplexer 164*b* may provide a selected value SV to the comparator 163*b*. In some embodiments, the selection signal TSEL may be an external value input by the test equipment 300.

The comparator 163*b* may receive the first count value CNT1 from the first counter 161*b* and the selected value SV from the multiplexer 164*b*.

The comparator 163*b* may output a test result signal TRES based on the result of comparing the first count value CNT1 with the selected value SV. Specifically, the comparator 163*b* may generate the test result signal TRES indicating whether the lower region of the bonding pad 120 has been damaged, based on the degree of the difference between the first count value CNT1 and the selected value SV. A detailed description thereof is given below with reference to FIG. 6.

Figure 5:
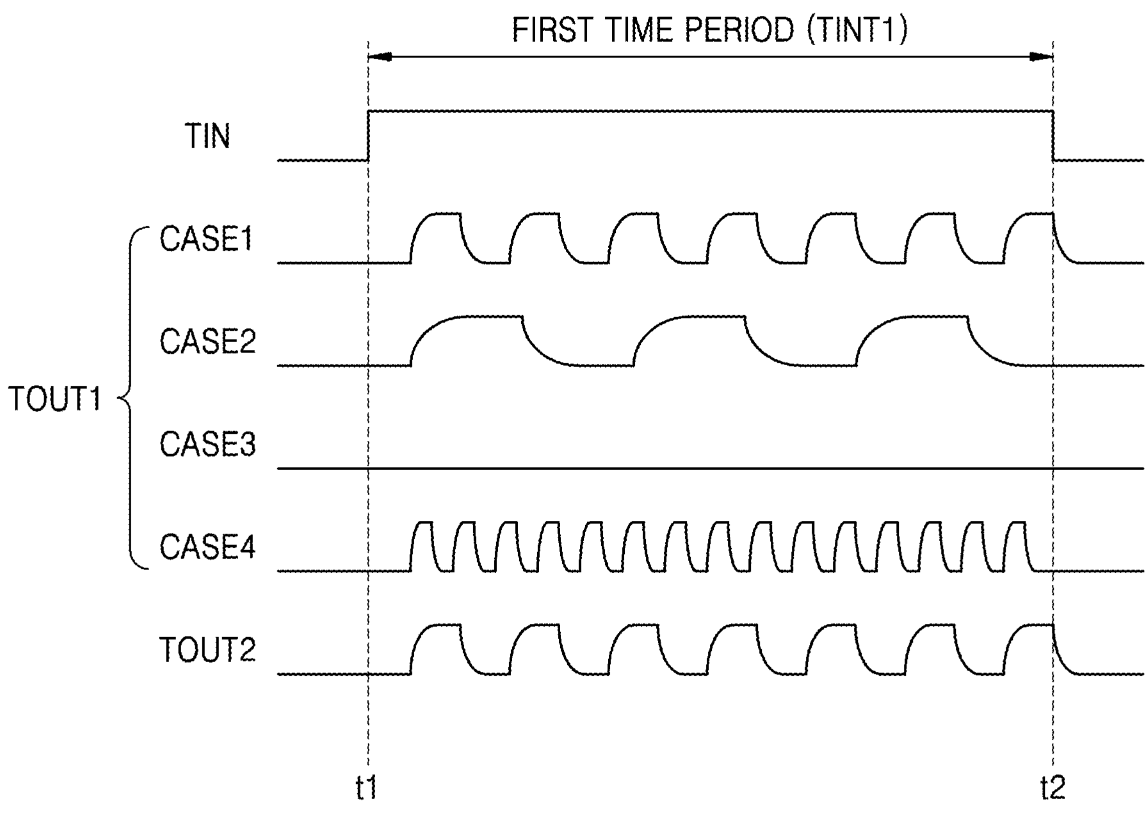
FIG. 5 illustrates a test input signal and test output signals according to an embodiment.

FIG. 5 illustrates a test input signal TIN and test output signals TOUT1 and TOUT2 according to an embodiment. FIG. 5 may be described with reference to FIGS. 1 to 4, and redundant descriptions may be omitted.

Referring to FIG. 5, the test input signal TIN may be applied to the first test pattern form 140 and the second test pattern form 150 during a first time period TINT1 from a first time t1 to a second time t2.

The damage detection circuit 160*a* may detect damage to the lower region of the bonding pad 120 based on the number of times the logic level of the first test output signal TOUT1 transitions from a low level to a high level. At this time, the second test output signal TOUT2 may be a determination criterion when the damage detection circuit 160*a* performs a comparison operation with the first test output signal TOUT1. In FIG. 5, it is assumed that the number of times the logic level of the second test output signal TOUT2 transitions from a low level to a high level during the first time period TINT1 is 7. Accordingly, the second count value CNT2 output by the second counter 162*a* may be 7. This is only an example to help understanding and not intended to limit the embodiments of the disclosure.

In an embodiment, when the lower region (e.g., the first region 120_1) of the bonding pad 120 has not been damaged, the form of the first test output signal TOUT1 may be the same as a first case CASE1 illustrated in FIG. 5. In this case, the first test output signal TOUT1 may be the same as the second test output signal TOUT2. As illustrated in FIG. 5, the first count value CNT1 corresponding to the first case CASE1 may be 7. Since the first count value CNT1 coincides with the second count value CNT2, the damage detection circuit 160*a* may output the test result signal TRES including the first value indicating that the lower region of the bonding pad 120 has not been damaged.

FIG. 5 illustrates that the form of the first test output signal TOUT1 corresponding to the first case CASE1 is the same as the second test output signal TOUT2, but in some embodiments, even when the form of the first test output signal TOUT1 corresponding to the first case CASE1 is not completely the same as the second test output signal TOUT2, the damage detection circuit 160*a* may determine the lower region of the bonding pad 120 has not been damaged. For example, when the difference between the first count value CNT1 and the second count value CNT2 is within an allowable error range, the damage detection circuit 160*a* may output the test result signal TRES including the first value indicating that the lower region of the bonding pad 120 has not been damaged. In the present specification, the expression "the form of the first test output signal TOUT1 is the same as the first case CASE1" may mean that the difference between the first count value CNT1 and the second count value CNT2 is within an allowable error range. A detailed description thereof is given below with reference to FIG. 6.

In an embodiment, when the lower region (e.g., the first region 120_1) of the bonding pad 120 has been damaged, the form of the first test output signal TOUT1 may be the same as a second case CASE2 illustrated in FIG. 5. The expression "the form of the first test output signal TOUT1 is the same as the second case CASE2" may mean that the lower region of the bonding pad 120 has been damaged, and thus, the first test pattern form 140 became thinner. As illustrated in FIG. 5, the first count value CNT1 corresponding to the second case CASE2 may be 3. Since the first count value CNT1 does not coincide with the second count value CNT2, the damage detection circuit 160*a* may output the test result signal TRES including the second value indicating that the lower region of the bonding pad 120 has been damaged.

In the present specification, the expression "the form of the first test output signal TOUT1 is the same as the second case CASE2" may mean that the difference between the first count value CNT1 and the second count value CNT2 is out of an allowable error range. A detailed description thereof is given below with reference to FIG. 6.

In an embodiment, when the lower region (e.g., the first region 120_1) of the bonding pad 120 has been damaged, the form of the first test output signal TOUT1 may be the same as a third case CASE3 illustrated in FIG. 5. The expression "the form of the first test output signal TOUT1 is the same as the third case CASE3" may mean that the lower region of the bonding pad 120 has been damaged, and thus, the first test pattern form 140 has been opened. As illustrated in FIG. 5, the first count value CNT1 corresponding to the third case CASE3 may be 0. Since the first count value CNT1 does not coincide with the second count value CNT2, the damage detection circuit 160*a* may output the test result signal TRES including the second value indicating that the lower region of the bonding pad 120 has been damaged.

In the present specification, the expression "the form of the first test output signal TOUT1 is the same as the third case CASE3" may mean that the difference between the first count value CNT1 and the second count value CNT2 is out of an allowable error range. A detailed description thereof is given below with reference to FIG. 6.

In an embodiment, when the lower region (e.g., the first region 120_1) of the bonding pad 120 has been damaged, the form of the first test output signal TOUT1 may be the same as a fourth case CASE4 illustrated in FIG. 5. The expression "the form of the first test output signal TOUT1 is the same as the fourth case CASE4" may mean that the lower region of the bonding pad 120 has been damaged, and thus, the first test pattern form 140 has been shorted. As illustrated in FIG. 5, the first count value CNT1 corresponding to the fourth case CASE4 may be 15. Since the first count value CNT1 does not coincide with the second count value CNT2, the damage detection circuit 160*a* may output the test result signal TRES including the second value indicating that the lower region of the bonding pad 120 has been damaged.

In the present specification, the expression "the form of the first test output signal TOUT1 is the same as the fourth case CASE4" may mean that the difference between the first count value CNT1 and the second count value CNT2 is out of an allowable error range. A detailed description thereof is given below with reference to FIG. 6.

Figure 6:
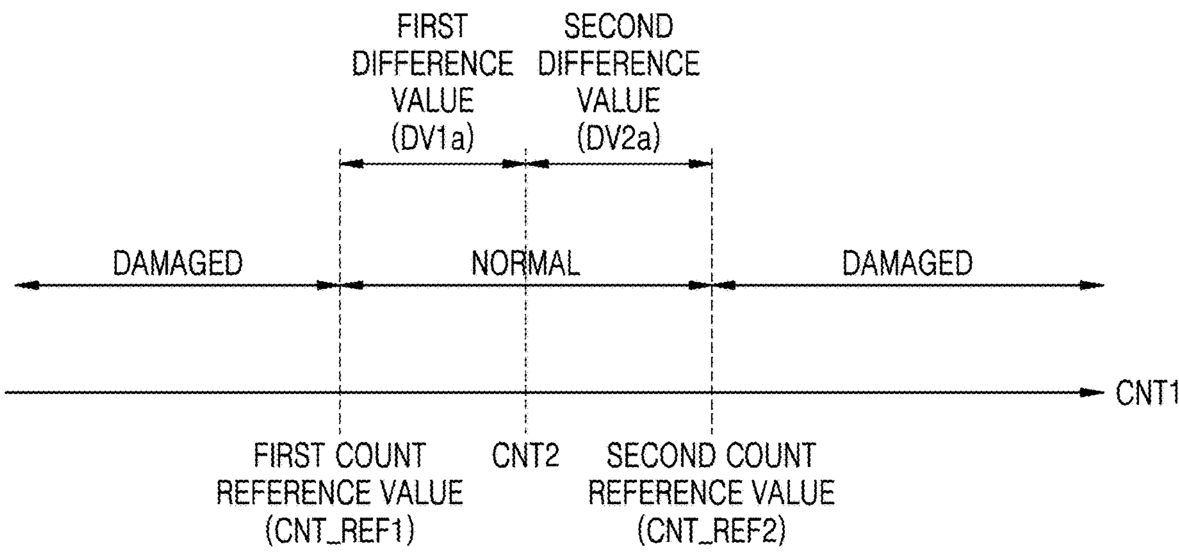
FIG. 6 is a graph showing an operation of a damage detection circuit according to an embodiment.

FIG. 6 is a graph showing the operation of the damage detection circuit 160*a* according to an embodiment. Specifically, FIG. 6 is a graph showing the operation in which the comparator 163*a* of FIG. 3 compares the first count value CNT1 with the second count value CNT2. FIG. 6 may be described with reference to FIGS. 1 to 5, and redundant descriptions may be omitted.

FIG. 6 illustrates a graph showing whether the first count value CNT1 is within a normal range or a damage range.

When the difference between the first count value CNT1 and the second count value CNT2 is within an allowable error range, the damage detection circuit 160*a* may output the test result signal TRES including the first value indicating that the lower region of the bonding pad 120 has not been damaged. In contrast, when the difference between the first count value CNT1 and the second count value CNT2 is out of an allowable error range, the damage detection circuit 160*a* may output the test result signal TRES including the second value indicating that the lower region of the bonding pad 120 has been damaged.

Referring to FIG. 6, a first count reference value CNT_REF1 and a second count reference value CNT_REF2 may be defined based on the second count value CNT2. The first count reference value CNT_REF1 may be less than the second count value CNT2. The second count reference value CNT_REF2 may be greater than the second count value CNT2. The difference between the second count value CNT2 and the first count reference value CNT_REF1 may be referred to as a first difference value DV1*a*. The difference between the second count reference value CNT_REF2 and the second count value CNT2 may be referred to as a second difference value DV2*a*.

In an embodiment, the first difference value DV1*a* may be equal to or different from the second difference value DV2*a*. The first difference value DV1*a* and the second difference value DV2*a* may be determined by a value previously input to the memory device 100 or the test equipment 300 or a value input by a user.

When the first count value CNT1 is greater than the first count reference value CNT_REF1 and less than the second count reference value CNT_REF2, the damage detection circuit 160*a* may determine that the first count value CNT1 is within an allowable error range. Therefore, in this case, it may be considered that the first count value CNT1 is within a normal range. This may mean that the lower region of the bonding pad 120 has not been damaged. Therefore, when the first count value CNT1 is greater than the first count reference value CNT_REF1 and less than the second count reference value CNT_REF2, the damage detection circuit 160*a* may output the test result signal TRES including the first value.

When the first count value CNT1 is less than the first count reference value CNT_REF1 or greater than the second count reference value CNT_REF2, the damage detection circuit 160*a* may determine that the first count value CNT1 is out of an allowable error range. Therefore, in this case, it may be considered that the first count value CNT1 is within a damage range. This may mean that the lower region of the bonding pad 120 has been damaged. Therefore, when the first count value CNT1 is less than the first count reference value CNT_REF1 or greater than the second count reference value CNT_REF2, the damage detection circuit 160*a* may output the test result signal TRES including the second value. In an example, the damage detection circuit is configured to, based on the first count value CNT1 indicating the first number of logic level transitions of the first test output signal is less than the first count reference value CNT_REF1 or greater than the second count reference value CNT_REF2, output the test result signal TRES indicating that the lower region of the bonding pad has been damaged.

In an embodiment, even when the comparator 163*b* of FIG. 4 performs an operation of comparing the first count value CNT1 with the selected value SV, the comparator 163*b* of FIG. 4 may generate the test result signal TRES by performing an operation similar to that of the comparator 163*a* of FIG. 3.

Figure 7:
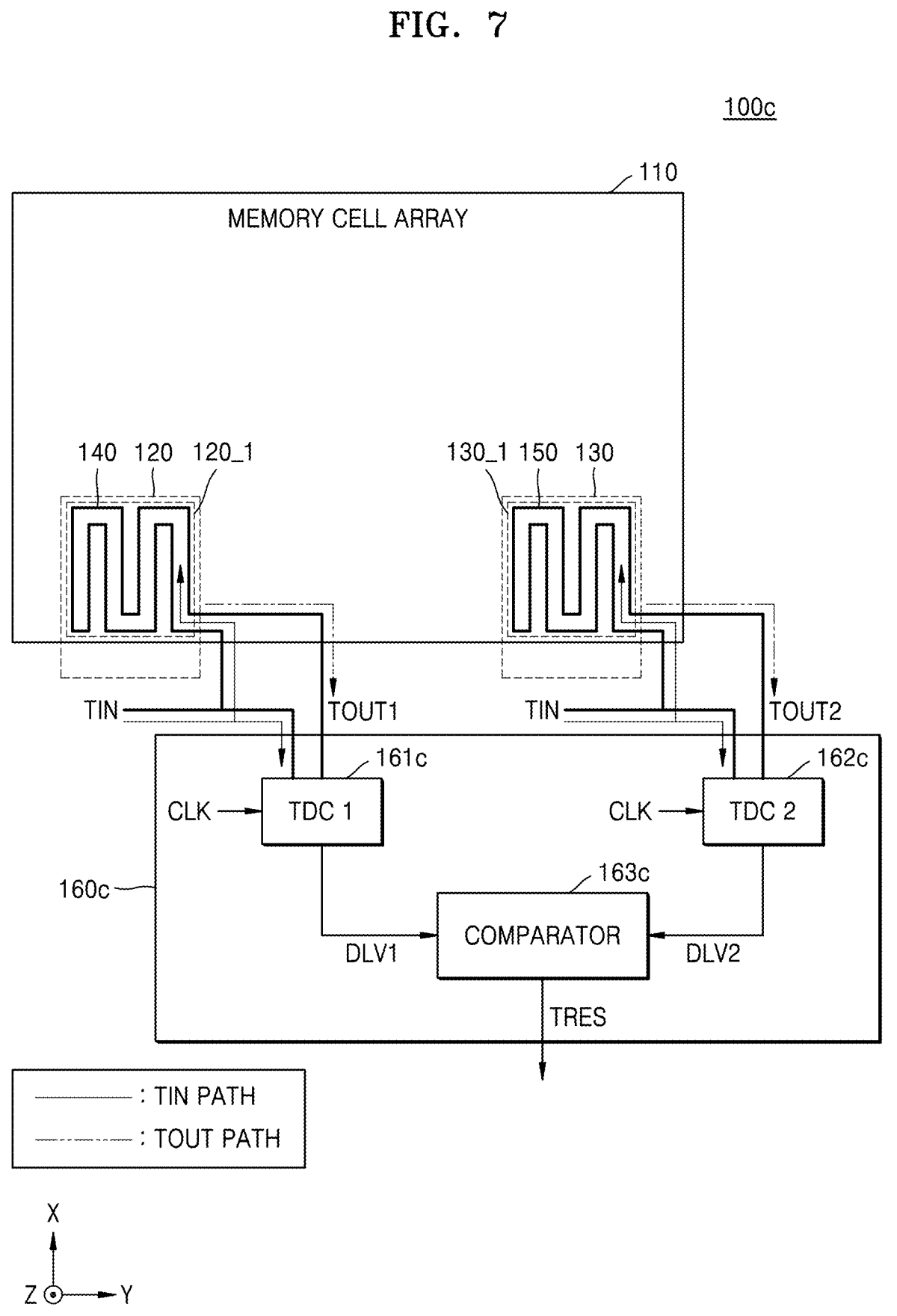

FIG. 7 is a block diagram illustrating a memory device 100*c* according to an embodiment. FIG. 7 may be described with reference to FIGS. 1, 2, and 3, and redundant descriptions may be omitted.

Referring to FIG. 7, the memory device 100*c* of FIG. 7 may correspond to the memory device 100 of FIG. 1. Specifically, FIG. 7 may be a plan view of the first test pattern form 140 disposed below the bonding pad 120 and the second test pattern form 150 disposed below the non-bonding pad 130 in FIG. 2.

When compared to the memory device 100*a* of FIG. 3, the memory device 100*c* of FIG. 7 may be configured to include a first time-to-digital conversion circuit 161*c* instead of the first counter 161*a* and a second time-to-digital conversion circuit 162*c* instead of the second counter 162*a*.

Referring to FIG. 7, the memory device 100*c* may include a memory cell array 110, a bonding pad 120, a non-bonding pad 130, a first test pattern form 140, a second test pattern form 150, and a damage detection circuit 160*c*.

The first test pattern form 140 may be disposed below the bonding pad 120. Specifically, the first test pattern form 140 may be disposed in a first region 120_1 in a lower region of the bonding pad 120.

The test equipment 300 may provide a test input signal TIN to the first test pattern form 140 and the first time-to-digital conversion circuit 161*c*. The test input signal TIN may pass through the first test pattern form 140 and may then be output as a first test output signal TOUT1. That is, the first test pattern form 140 may provide the first test output signal TOUT1 to the damage detection circuit 160*c*.

The second test pattern form 150 may be disposed below the non-bonding pad 130. Specifically, the second test pattern form 150 may be disposed in a memory cell region 130_1 in a lower region of the non-bonding pad 130.

The test equipment 300 may provide the test input signal TIN to the second test pattern form 150 and the second time-to-digital conversion circuit 162*c*. The test input signal TIN may pass through the second test pattern form 150 and may be then output as a second test output signal TOUT2. That is, the second test pattern form 150 may provide the second test output signal TOUT2 to the damage detection circuit 160*c*. The second test output signal TOUT2 may be a comparison criterion when a comparator 163*c* performs a comparison operation with the first test output signal TOUT1.

The damage detection circuit 160*c* may include the first time-to-digital conversion circuit 161*c*, the second time-to-digital conversion circuit 162*c*, and the comparator 163*c*.

The first time-to-digital conversion circuit 161*c* may perform an operation based on a clock signal CLK. In some embodiments, the clock signal CLK may be generated by a peripheral circuit of the memory device 100*c* or may be generated by a clock generator separately provided in the damage detection circuit 160*c*.

The first time-to-digital conversion circuit 161*c* may receive the first test output signal TOUT1 and may output a first delay value DLV1 indicating the degree to which the first test output signal TOUT1 is delayed compared to the test input signal TIN. The first test output signal TOUT1 output by the first test pattern form 140 may be a signal delayed from the test input signal TIN by a first delay time. At this time, the first delay time may vary depending on whether the lower region of the bonding pad 120 has been damaged. The first delay value DLV1 may be a value corresponding to the first delay time. In some embodiments, the first delay value DLV1 may be a value composed of N bits (where N is a natural number greater than or equal to 1).

The second time-to-digital conversion circuit 162*c* may perform an operation based on the clock signal CLK. The second time-to-digital conversion circuit 162*c* may receive the second test output signal TOUT2 and may output a second delay value DLV2 indicating the degree to which the second test output signal TOUT2 is delayed compared to the test input signal TIN. The second test output signal TOUT2 output by the second test pattern form 150 may be a signal delayed from the test input signal TIN by a second delay time. The second delay value DLV2 may be a value corresponding to the second delay time. In some embodiments, the second delay value DLV2 may be a value composed of N bits (where N is a natural number greater than or equal to 2).

The comparator 163*c* may receive the first delay value DLV1 from the first time-to-digital conversion circuit 161*c* and may receive the second delay value DLV2 from the second time-to-digital conversion circuit 162*c*. The comparator 163*c* may output a test result signal TRES based on the result of comparing the first delay value DLV1 with the second delay value DLV2. Specifically, the comparator 163*c* may generate the test result signal TRES indicating whether the lower region of the bonding pad 120 has been damaged, based on the degree of the difference between the first delay value DLV1 and the second delay value DLV2. A detailed description thereof is given below with reference to FIG. 10.

Figure 8:
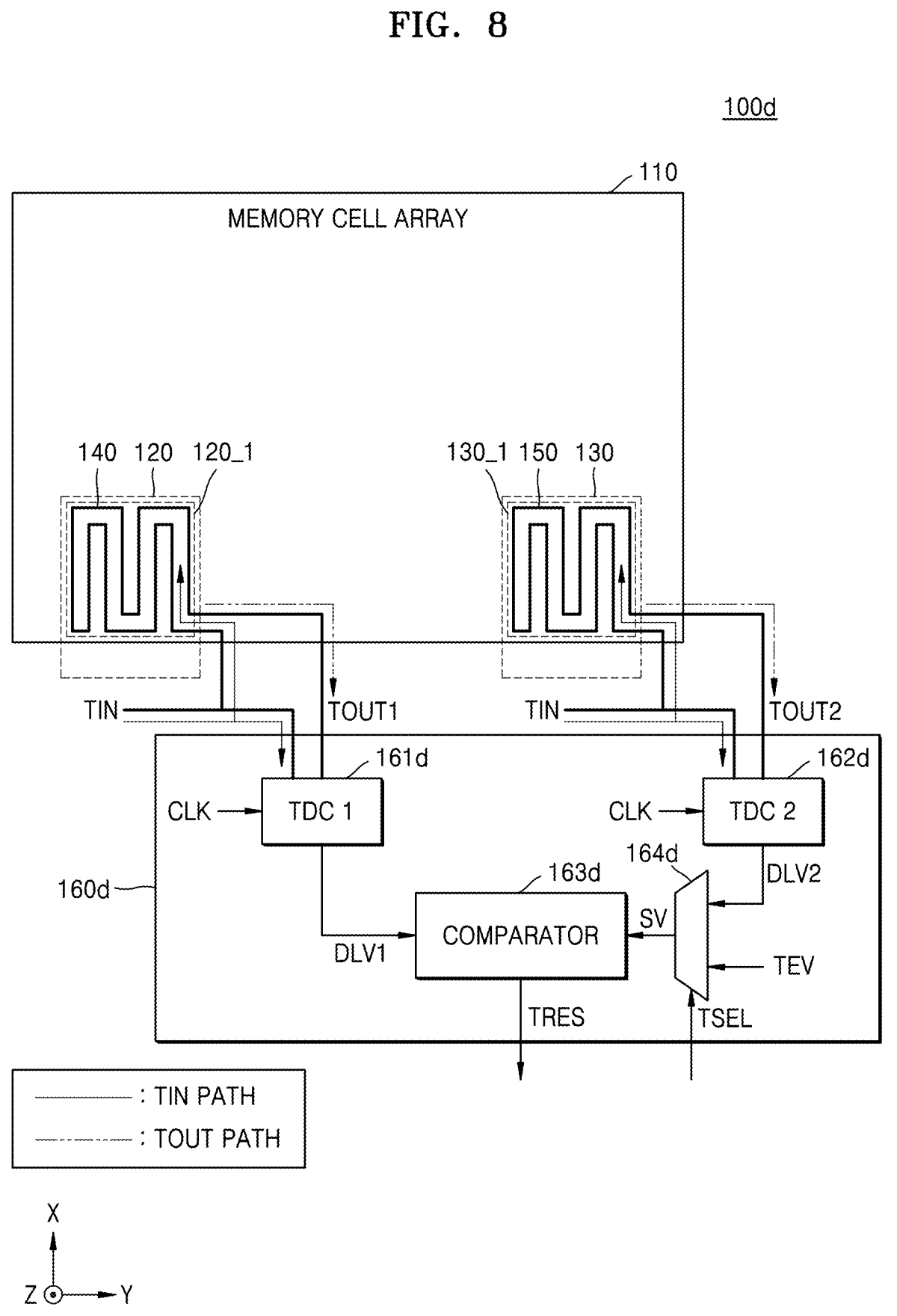

FIG. 8 is a block diagram illustrating a memory device 100*d* according to an embodiment. Specifically, a damage detection circuit 160*d* of FIG. 8 may further include a multiplexer 164*d*, compared to the damage detection circuit 160*c* of FIG. 7. FIG. 8 may be described with reference to FIGS. 1, 2, 4, and 7, and redundant descriptions may be omitted. In FIG. 8, the differences from the memory device 100*c* of FIG. 7 are mainly described.

Referring to FIG. 8, the memory device 100*d* of FIG. 8 may correspond to the memory device 100 of FIG. 1 and the memory device 100*c* of FIG. 7. The memory device 100*d* may include a memory cell array 110, a bonding pad 120, a non-bonding pad 130, a first test pattern form 140, a second test pattern form 150, and the damage detection circuit 160*d*.

The damage detection circuit 160*d* may include a first time-to-digital conversion circuit 161*d*, a second time-to-digital conversion circuit 162*d*, a comparator 163*d*, and the multiplexer 164*d*. The first time-to-digital conversion circuit 161*d* may correspond to the first time-to-digital conversion circuit 161*c* of FIG. 7 and the second time-to-digital conversion circuit 162*d* may correspond to the second time-to-digital conversion circuit 162*c* of FIG. 7.

The multiplexer 164*d* may receive a second delay value DLV2 from the second time-to-digital conversion circuit 162*d*. In addition, the multiplexer 164*d* may receive a test expectation value TEV from the outside. In some embodiments, the test expectation value TEV may be a value previously input to the memory device 100*b* or an external value input by the test equipment 300. The test expectation value TEV may be different from the second delay value DLV2.

The multiplexer 164*d* may select one of the second delay value DLV2 and the test expectation value TEV based on a selection signal TSEL. The multiplexer 164*d* may provide a selected value SV to the comparator 163*d*. In some embodiments, the selection signal TSEL may be an external value input by the test equipment 300.

The comparator 163*d* may receive a first delay value DLV1 from the first time-to-digital conversion circuit 161*d* and the selected value SV from the multiplexer 164*d*.

The comparator 163*d* may output a test result signal TRES based on the result of comparing the first delay value DLV1 with the selected value SV. Specifically, the comparator 163*d* may generate the test result signal TRES indicating whether the lower region of the bonding pad 120 has been damaged, based on the degree of the difference between the first delay value DLV1 and the selected value SV. A detailed description thereof is given below with reference to FIG. 10.

Figure 9:
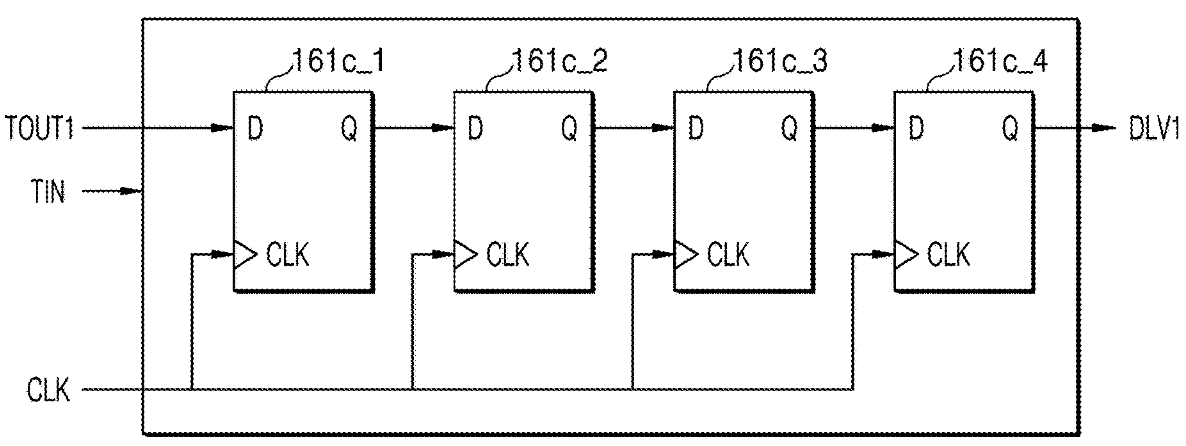
FIG. 9 is a block diagram illustrating a time-to-digital conversion circuit according to an embodiment.

FIG. 9 is a block diagram illustrating a time-to-digital conversion circuit 161*c* according to an embodiment. Specifically, FIG. 9 is a diagram for describing the first time-to-digital conversion circuit 161*c* of FIG. 7. FIG. 9 may be described with reference to FIGS. 7 and 8, and redundant descriptions may be omitted.

Referring to FIG. 9, the first time-to-digital conversion circuit 161*c* may include a first flip-flop 161*c*_1, a second flip-flop 161*c*_2, a third flip-flop 161*c*_3, and a fourth flip-flop 161*c*_4. Although FIG. 9 illustrates that the first time-to-digital conversion circuit 161*c* includes four flip-flops, this is only an example to help understanding and not intended to limit the embodiments of the disclosure. Accordingly, the first time-to-digital conversion circuit 161*c* may include more or less than four flip-flops.

The first time-to-digital conversion circuit 161*c* may perform an operation based on a clock signal CLK. The first time-to-digital conversion circuit 161*c* may receive a first test output signal TOUT1, and the received first test output signal TOUT1 may be output as a first delay value DLV1 through the first flip-flop 161*c*_1 to the fourth flip-flop 161*c*_4. The first delay value DLV1 may be a value corresponding to a first delay time that is a delay time of the first test output signal TOUT1 with respect to a test input signal TIN.

Although FIG. 9 illustrates the first time-digital conversion circuit 161*c* of FIG. 7 as an example, the second time-to-digital conversion circuit 162*c* of FIG. 7 may be configured to have the same configuration as that of the first time-to-digital conversion circuit 161*c* of FIG. 9.

Figure 10:
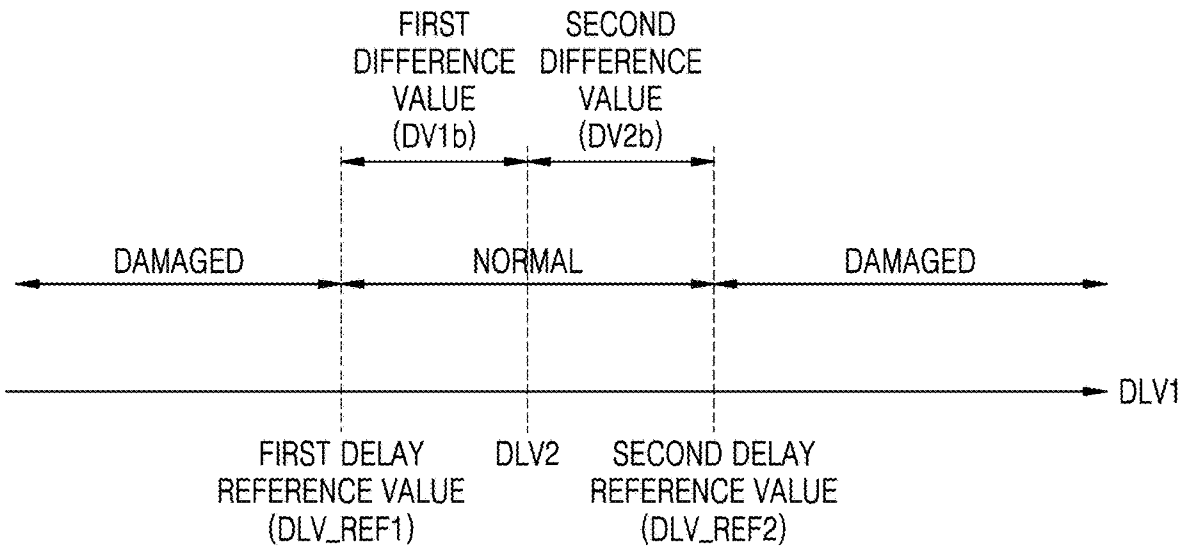
FIG. 10 is a graph showing an operation of a damage detection circuit according to an embodiment.

FIG. 10 is a graph showing the operation of the damage detection circuit 160*c* according to an embodiment. Specifically, FIG. 10 is a graph showing the operation in which the comparator 163*c* of FIG. 7 compares the first delay value DLV1 with the second delay value DLV2. FIG. 10 may be described with reference to FIGS. 1, 2, and 7 to 9, and redundant descriptions may be omitted.

FIG. 10 illustrates a graph showing whether the first delay value DLV1 is within a normal range or a damage range.

When the difference between the first delay value DLV1 and the second delay value DLV2 is within an allowable error range, the damage detection circuit 160*c* may output the test result signal TRES including the first value indicating that the lower region of the bonding pad 120 has not been damaged. In contrast, when the difference between the first delay value DLV1 and the second delay value DLV2 is out of an allowable error range, the damage detection circuit 160*c* may output the test result signal TRES including the second value indicating that the lower region of the bonding pad 120 has been damaged.

Referring to FIG. 10, a first delay reference value DLV_REF1 and a second delay reference value DLV_REF2 may be defined based on the second delay value DLV2. The first delay reference value DLV_REF1 may be less than the second delay value DLV2. The second delay reference value DLV_REF2 may be greater than the second delay value DLV2. The difference between the second delay value DLV2 and the first delay reference value DLV_REF1 may be referred to as a first difference value DV1*a*. The difference between the second delay reference value DLV_REF2 and the second delay value DLV2 may be referred to as a second difference value DV2*a*.

In an embodiment, the first difference value DV1*a* may be equal to or different from the second difference value DV2*a*. The first difference value DV1*a* and the second difference value DV2*a* may be determined by a value previously input to the memory device 100 or the test equipment 300 or a value input by a user.

When the first delay value DLV1 is greater than the first delay reference value DLV_REF1 and less than the second delay reference value DLV_REF2, the damage detection circuit 160*c* may determine that the first delay value DLV1 is within an allowable error range. Therefore, in this case, it may be considered that the first delay value DLV1 is within a normal range. This may mean that the lower region of the bonding pad 120 has not been damaged. Therefore, when the first delay value DLV1 is greater than the first delay reference value DLV_REF1 and less than the second delay reference value DLV_REF2, the damage detection circuit 160*c* may output the test result signal TRES including the first value.

When the first delay value DLV1 is less than the first delay reference value DLV_REF1 or greater than the second delay reference value DLV_REF2, the damage detection circuit 160*c* may determine that the first delay value DLV1 is out of an allowable error range. Therefore, in this case, it may be considered that the first delay value DLV1 is within a damage range. This may mean that the lower region of the bonding pad 120 has been damaged. Therefore, when the first delay value DLV1 is less than the first delay reference value DLV_REF1 or greater than the second delay reference value DLV_REF2, the damage detection circuit 160*c* may output the test result signal TRES including the second value.

In an embodiment, even when the comparator 163*d* of FIG. 8 performs an operation of comparing the first delay value DLV1 with the selected value SV, the comparator 163*d* of FIG. 8 may generate the test result signal TRES by performing an operation similar to that of the comparator 163*c* of FIG. 7.

FIG. 11 is a cross-sectional view for describing a memory device 100 according to an embodiment. FIG. 11 may be described with reference to FIGS. 1 to 10, and redundant descriptions may be omitted.

FIG. 11 corresponds to a cross-section of the memory device 100 of FIG. 2 taken along line I-I' of FIG. 2. FIG. 11 is a cross-sectional view of the bonding pad 120 and the lower region of the bonding pad 120. The cross-sectional view of the non-bonding pad 130 and the lower region of the non-bonding pad 130 may also be similar to FIG. 11.

Referring to FIG. 11, the memory device 100 may be divided into a cell region CELL and a peripheral circuit area PERI in a first direction and may be divided into a first region 120_1 and a second region 120_2 in a third direction.

The memory device 100 may include an insulating layer 121, a first upper metal layer TMET1, a second upper metal layer TMET2, a third upper metal layer TMET3, a first lower metal layer BMET1, and a second lower metal layer BMET2.

A first test pattern form 140*a* of FIG. 11 may correspond to the first test pattern form 140 of FIG. 1. The first test pattern form 140*a* may be disposed below the bonding pad 120. Specifically, the first test pattern form 140*a* may be disposed in a first region 120_1 in the lower region of the bonding pad 120. The first test pattern form 140*a* may include a first sub-test pattern form 140_1*a*, a second sub-test pattern form 140_2*a*, and a third sub-test pattern form 140_3*a*. The first test pattern form 140*a* including the three sub-test pattern forms is only an example to help understanding and not intended to limit embodiments of the disclosure. Accordingly, the first test pattern form 140*a* may include more or less than three sub-test pattern forms.

The bonding pad 120 may be connected to a first upper metal line TM1 through a first upper contact TCT1. The first upper metal layer TMET1 may include the first upper metal line TM1 and the second sub-test pattern form 140_2*a*. The first sub-test pattern form 140_1*a* may be disposed above the second sub-test pattern shape portion 140_2*a* in a vertical direction. The first sub-test pattern form 140_1*a* may be connected to an upper bonding metal pattern TBM through a first upper test pattern contact TCT1*a*. The second sub-test pattern form 140_2*a* may be connected to an upper bonding metal pattern TBM through a second upper test pattern contact TCT2*a*.

The second upper metal layer TMET2 may include a second upper metal line TM2 and the third sub-test pattern form 140_3*a*. The second upper metal line TM2 may be connected to the first upper metal line TM1 through a second upper contact TCT2. The third sub-test pattern form 140_3*a* may be disposed below the second sub-test pattern in an 140_2*a* in a vertical direction. The third sub-test pattern form 140_3*a* may be connected to an upper bonding metal pattern TBM through a third upper test pattern contact TCT3*a*.

The third upper metal layer TMET3 may include the upper bonding metal pattern TBM. The second lower metal layer BMET2 may include a lower bonding metal pattern BBM. The upper bonding metal pattern TBM of the third upper metal layer TMET3 and the lower bonding metal pattern BBM of the second lower metal layer BMET2 may be connected to each other by a bonding method.

The first lower metal layer BMET1 may include a first lower metal line BM1 disposed in the first region 120_1 and a second lower metal line BM2 disposed in the second region 120_2. The first lower metal line BM1 may be connected to the lower bonding metal pattern BBM through a first lower test pattern contact BCT1*a*. The second lower metal line BM2 may be connected to the lower bonding metal pattern BBM through a second lower contact BCT2. The second lower metal line BM2 may be connected to peripheral circuits of the memory device 100 through a first lower contact BCT1.

In an embodiment, when the first test pattern form 140*a* is configured as illustrated in FIG. 11, the test equipment 300 may apply the test input signal TIN to each of the first sub-test pattern form 140_1*a*, the second sub-test pattern form 140_2*a*, and the third sub-test pattern form 140_3*a*. In this case, the damage detection circuit 160 may determine which of the metal layers included in the memory device 100 damage has been damaged, through the test output signal received from each of the sub-test pattern forms. For example, the damage detection circuit 160 may determine whether a region, where the first sub-test pattern form 140_1*a* is disposed, has been damaged, through the test output signal received from the first sub-test pattern form 140_1*a*.

FIG. 12 is a cross-sectional view for describing a memory device 100 according to an embodiment. FIG. 12 may be described with reference to FIGS. 1 to 11, and redundant descriptions may be omitted. In FIG. 12, the differences from FIG. 11 are mainly described.

FIG. 12 corresponds to a cross-section of the memory device 100 of FIG. 2 taken along line I-I' of FIG. 2. FIG. 12 is a cross-sectional view of the bonding pad 120 and the lower region of the bonding pad 120. The cross-sectional view of the non-bonding pad 130 and the lower region of the non-bonding pad 130 may also be similar to FIG. 12. A first test pattern form 140*b* of FIG. 12 may correspond to the first test pattern form 140 of FIG. 1.

Referring to FIG. 12, the first test pattern form 140*b* may include a first sub-test pattern form 140_1*b*, a second sub-test pattern form 140_2*b*, and a third sub-test pattern form 140_3*b*.

The first sub-test pattern form 140_1*b* may be connected to an upper bonding metal pattern TBM through a first upper test pattern contact TCT1*b*. The first sub-test pattern form 140_1*b* may be connected to the second sub-test pattern form 140_2*b* through a second upper test pattern contact TCT2*b*. The second sub-test pattern form 140_2*b* may be connected to the third sub-test pattern shape portion 140_3*b* through a third upper test pattern contact TCT3*b*. The third sub-test pattern form 140_3*b* may be connected to an upper bonding metal pattern TBM through a fourth upper test pattern contact TCT4*b*. The first lower metal line BM1 may be connected to the lower bonding metal pattern BBM through a first lower test pattern contact BCT1*b*.

In an embodiment, when the first test pattern form 140*b* is configured as illustrated in FIG. 12, the damage detection circuit 160 may determine that the lower region of the bonding pad 120 has been damaged, based on a test output signal provided from one of the first sub-test pattern form 140_1*b*, the second sub-test pattern form 140_2*b*, and the third sub-test pattern form 140_3*b*.

FIG. 13 is a cross-sectional view for describing a memory device 100 according to an embodiment. FIG. 13 may be described with reference to FIGS. 1 to 12, and redundant descriptions may be omitted. In FIG. 13, the differences from FIG. 11 are mainly described.

FIG. 13 corresponds to a cross-section of the memory device 100 of FIG. 2 taken along line I-I' of FIG. 2. FIG. 13 is a cross-sectional view of the bonding pad 120 and the lower region of the bonding pad 120. The cross-sectional view of the non-bonding pad 130 and the lower region of the non-bonding pad 130 may also be similar to FIG. 13. A first test pattern form 140*c* of FIG. 13 may correspond to the first test pattern form 140 of FIG. 1.

Referring to FIG. 13, the first test pattern form 140*c* may include a first sub-test pattern form 140_1*c*, a second sub-test pattern form 140_2*c*, and a third sub-test pattern form 140_3*c*.

The first sub-test pattern form 140_1*c* may be connected to an upper bonding metal pattern TBM through a first upper test pattern contact TCT1*c*. The first sub-test pattern form 140_1*c* may be connected to the third sub-test pattern form 140_3*c* through a second upper test pattern contact TCT2*c*. The second sub-test pattern form 140_2*c* may be connected to an upper bonding metal pattern TBM through a third upper test pattern contact TCT3*c*. The third sub-test pattern form 140_3*c* may be connected to an upper bonding metal pattern TBM through a fourth upper test pattern contact TCT4*c*. The first lower metal line BM1 may be connected to the lower bonding metal pattern BBM through a first lower test pattern contact BCT1*c*.

In an embodiment, when the first test pattern form 140*c* is configured as illustrated in FIG. 13, the damage detection circuit 160 may detect a bridge between the sub-test pattern forms. In other words, the damage detection circuit 160 may detect damage occurring between the sub-test pattern forms. For example, the first sub-test pattern form 140_1*c* may not be connected to the second sub-test pattern form 140_2*c* and may be connected to the third sub-test pattern form 140_3*c*. At this time, when a bridge exists between the first sub-test pattern form 140_1*c* and the second sub-test pattern form 140_2*c*, a signal applied from the second sub-test pattern form 140_2*c* to the first sub-test pattern form 140_1*c* may be detected. In this manner, the damage detection circuit 160 may detect a bridge occurring between the first sub-test pattern form 140_1*c* and the second sub-test pattern form 140_2*c*. This may mean that the lower region the bonding pad 120 has been damaged.

Figure 14:
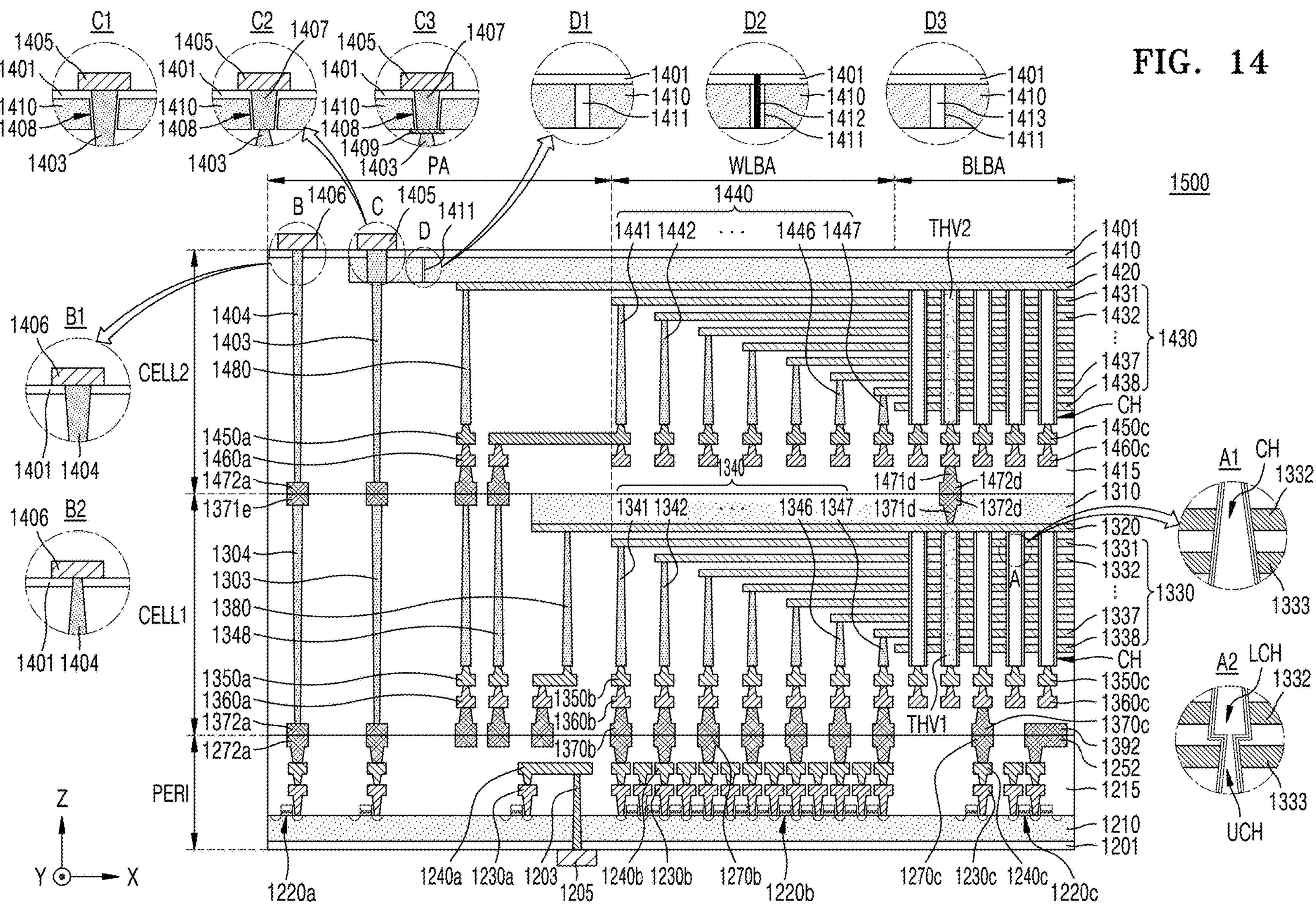
FIG. 14 is a diagram for describing a memory device according to an embodiment.

FIG. 14 is a view illustrating a memory device 1500 according to some embodiments.

Referring to FIG. 14, the memory device 1500 may have a C2C structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 1500 may include the at least one upper chip including the cell region. For example, as illustrated in FIG. 14, the memory device 1500 may include two upper chips. However, the number of the upper chips is not limited thereto. In the case in which the memory device 1500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 1500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 14. However, embodiments are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 1500 may include an external pad bonding region PA, a word line bonding region WLBA, and a bit line bonding region BLBA.

The peripheral circuit region PERI may include a first substrate 1210 and a plurality of circuit elements 1220*a*, 1220*b* and 1220*c* formed on the first substrate 1210. An interlayer insulating layer 1215 including one or more insulating layers may be provided on the plurality of circuit elements 1220*a*, 1220*b* and 1220*c*, and a plurality of metal lines electrically connected to the plurality of circuit elements 1220*a*, 1220*b* and 1220*c* may be provided in the interlayer insulating layer 1215. For example, the plurality of metal lines may include first metal lines 1230*a*, 1230*b* and 1230*c* connected to the plurality of circuit elements 1220*a*, 1220*b* and 1220*c*, and second metal lines 1240*a*, 1240*b* and 1240*c* formed on the first metal lines 1230*a*, 1230*b* and 1230*c*. The plurality of metal lines may be formed of at least one of various conductive materials. For example, the first metal lines 1230*a*, 1230*b* and 1230*c* may be formed of tungsten having a relatively high electrical resistivity, and the second metal lines 1240*a*, 1240*b* and 1240*c* may be formed of copper having a relatively low electrical resistivity.

The first metal lines 1230*a*, 1230*b* and 1230*c* and the second metal lines 1240*a*, 1240*b* and 1240*c* are illustrated and described in the present embodiments. However, embodiments are not limited thereto. In certain embodiments, at least one or more additional metal lines may further be formed on the second metal lines 1240*a*, 1240*b* and 1240*c*. In this case, the second metal lines 1240*a*, 1240*b* and 1240*c* may be formed of aluminum, and at least some of the additional metal lines formed on the second metal lines 1240*a*, 1240*b* and 1240*c* may be formed of copper having an electrical resistivity lower than that of aluminum of the second metal lines 1240*a*, 1240*b* and 1240*c*.

The interlayer insulating layer 1215 may be disposed on the first substrate 1210 and may include an insulating material such as silicon oxide and/or silicon nitride.

Each of the first and second cell regions CELL1 and CELL2 may include at least one memory block. The first cell region CELL1 may include a second substrate 1310 and a common source line 1320. A plurality of word lines 1330 (1331 to 1338) may be stacked on the second substrate 1310 in a direction (i.e., the Z-axis direction) perpendicular to a top surface of the second substrate 1310. String selection lines and a ground selection line may be disposed on and under the word lines 1330, and the plurality of word lines 1330 may be disposed between the string selection lines and the ground selection line. Likewise, the second cell region CELL2 may include a third substrate 1410 and a common source line 1420, and a plurality of word lines 1430 (1431 to 1438) may be stacked on the third substrate 1410 in a direction (i.e., the Z-axis direction) perpendicular to a top surface of the third substrate 1410. Each of the second substrate 1310 and the third substrate 1410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 1310 to penetrate the word lines 1330, the string selection lines, and the ground selection line. The channel structure CH may include a data storage layer, a channel layer, and a filling insulation layer. The channel layer may be electrically connected to a first metal line 1350*c* and a second metal line 1360*c* in the bit line bonding region BLBA. For example, the second metal line 1360*c* may be a bit line and may be connected to the channel structure CH through the first metal line 1350*c*. The bit line 1360*c* may extend in a first direction (e.g., a Y-axis direction) parallel to the top surface of the second substrate 1310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 1310 to penetrate the common source line 1320 and lower word lines 1331 and 1332. The lower channel LCH may include a data storage layer, a channel layer, and a filling insulation layer and may be connected to the upper channel UCH. The upper channel UCH may penetrate upper word lines 1333 to 1338. The upper channel UCH may include a data storage layer, a channel layer, and a filling insulation layer, and the channel layer of the upper channel UCH may be electrically connected to the first metal line 1350*c* and the second metal line 1360*c*. As a length of a channel increases, due to characteristics of manufacturing processes, it may be difficult to form a channel having a substantially uniform width. The memory device 1500 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 1332 and 1333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, the number of the lower word lines 1331 and 1332 penetrated by the lower channel LCH is less than the number of the upper word lines 1333 to 1338 penetrated by the upper channel UCH in the region 'A2'. However, embodiments are not limited thereto. In certain embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 14, the first through-electrode THV1 may penetrate the common source line 1320 and the plurality of word lines 1330. In certain embodiments, the first through-electrode THV1 may further penetrate the second substrate 1310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 1372*d* and a second through-metal pattern 1472*d*. The first through-metal pattern 1372*d* may be formed at a bottom end of the first upper chip including the first cell region CELL1, and the second through-metal pattern 1472*d* may be formed at a top end of the second upper chip including the second cell region CELL2. The first through-electrode THV1 may be electrically connected to the first metal line 1350*c* and the second metal line 1360*c*. A lower via 1371*d* may be formed between the first through-electrode THV1 and the first through-metal pattern 1372*d*, and an upper via 1471*d* may be formed between the second through-electrode THV2 and the second through-metal pattern 1472*d*. The first through-metal pattern 1372*d* and the second through-metal pattern 1472*d* may be connected to each other by the bonding method.

In addition, in the bit line bonding region BLBA, an upper metal pattern 1252 may be formed in an uppermost metal layer of the peripheral circuit region PERI, and an upper metal pattern 1392 having the same shape as the upper metal pattern 1252 may be formed in an uppermost metal layer of the first cell region CELL1. The upper metal pattern 1392 of the first cell region CELL1 and the upper metal pattern 1252 of the peripheral circuit region PERI may be electrically connected to each other by the bonding method. In the bit line bonding region BLBA, the bit line 1360*c* may be electrically connected to a page buffer included in the peripheral circuit region PERI. For example, some of the circuit elements 1220*c* of the peripheral circuit region PERI may constitute the page buffer, and the bit line 1360*c* may be electrically connected to the circuit elements 1220*c* constituting the page buffer through an upper bonding metal pattern 1370*c* of the first cell region CELL1 and an upper bonding metal pattern 1270*c* of the peripheral circuit region PERI.

Referring continuously to FIG. 14, in the word line bonding region WLBA, the word lines 1330 of the first cell region CELL1 may extend in a second direction (e.g., an X-axis direction) parallel to the top surface of the second substrate 1310 and may be connected to a plurality of cell contact plugs 1340 (1341 to 1347). First metal lines 1350*b* and second metal lines 1360*b* may be sequentially connected onto the cell contact plugs 1340 connected to the word lines 1330. In the word line bonding region WLBA, the cell contact plugs 1340 may be connected to the peripheral circuit region PERI through upper bonding metal patterns 1370*b* of the first cell region CELL1 and upper bonding metal patterns 1270*b* of the peripheral circuit region PERI.

The cell contact plugs 1340 may be electrically connected to a row decoder included in the peripheral circuit region PERI. For example, some of the circuit elements 1220*b* of the peripheral circuit region PERI may constitute the row decoder, and the cell contact plugs 1340 may be electrically connected to the circuit elements 1220*b* constituting the row decoder through the upper bonding metal patterns 1370*b* of the first cell region CELL1 and the upper bonding metal patterns 1270*b* of the peripheral circuit region PERI. In some embodiments, an operating voltage of the circuit elements 1220*b* constituting the row decoder may be different from an operating voltage of the circuit elements 1220*c* constituting the page buffer. For example, the operating voltage of the circuit elements 1220*c* constituting the page buffer may be greater than the operating voltage of the circuit elements 1220*b* constituting the row decoder.

Likewise, in the word line bonding region WLBA, the word lines 1430 of the second cell region CELL2 may extend in the second direction (e.g., the X-axis direction) parallel to the top surface of the third substrate 1410 and may be connected to a plurality of cell contact plugs 1440 (1441 to 1447). The cell contact plugs 1440 may be connected to the peripheral circuit region PERI through an upper metal pattern of the second cell region CELL2 and lower and upper metal patterns and a cell contact plug 1348 of the first cell region CELL1.

In the word line bonding region WLBA, the upper bonding metal patterns 1370*b* may be formed in the first cell region CELL1, and the upper bonding metal patterns 1270*b* may be formed in the peripheral circuit region PERI. The upper bonding metal patterns 1370*b* of the first cell region CELL1 and the upper bonding metal patterns 1270*b* of the peripheral circuit region PERI may be electrically connected to each other by the bonding method. The upper bonding metal patterns 1370*b* and the upper bonding metal patterns 1270*b* may be formed of aluminum, copper, or tungsten.

In the external pad bonding region PA, a lower metal pattern 1371*e* may be formed in a lower portion of the first cell region CELL1, and an upper metal pattern 1472*a* may be formed in an upper portion of the second cell region CELL2. The lower metal pattern 1371*e* of the first cell region CELL1 and the upper metal pattern 1472*a* of the second cell region CELL2 may be connected to each other by the bonding method in the external pad bonding region PA. Likewise, an upper metal pattern 1372*a* may be formed in an upper portion of the first cell region CELL1, and an upper metal pattern 1272*a* may be formed in an upper portion of the peripheral circuit region PERI. The upper metal pattern 1372*a* of the first cell region CELL1 and the upper metal pattern 1272_a_ of the peripheral circuit region PERI may be connected to each other by the bonding method.

Common source line contact plugs 1380 and 1480 may be disposed in the external pad bonding region PA. The common source line contact plugs 1380 and 1480 may be formed of a conductive material such as a metal, a metal compound, and/or doped polysilicon. The common source line contact plug 1380 of the first cell region CELL1 may be electrically connected to the common source line 1320, and the common source line contact plug 1480 of the second cell region CELL2 may be electrically connected to the common source line 1420. A first metal line 1350_a_ and a second metal line 1360_a_ may be sequentially stacked on the common source line contact plug 1380 of the first cell region CELL1, and a first metal line 1450_a_ and a second metal line 1460_a_ may be sequentially stacked on the common source line contact plug 1480 of the second cell region CELL2.

Input/output pads 1205, 1405 and 1406 may be disposed in the external pad bonding region PA. Referring to FIG. 14, a lower insulating layer 1201 may cover a bottom surface of the first substrate 1210, and a first input/output pad 1205 may be formed on the lower insulating layer 1201. The first input/output pad 1205 may be connected to at least one of a plurality of the circuit elements 1220_a_ disposed in the peripheral circuit region PERI through a first input/output contact plug 1203 and may be separated from the first substrate 1210 by the lower insulating layer 1201. In addition, a side insulating layer may be disposed between the first input/output contact plug 1203 and the first substrate 1210 to electrically isolate the first input/output contact plug 1203 from the first substrate 1210.

An upper insulating layer 1401 covering a top surface of the third substrate 1410 may be formed on the third substrate 1410. A second input/output pad 1405 and/or a third input/output pad 1406 may be disposed on the upper insulating layer 1401. The second input/output pad 1405 may be connected to at least one of the plurality of circuit elements 1220_a_ disposed in the peripheral circuit region PERI through second input/output contact plugs 1403 and 1303, and the third input/output pad 1406 may be connected to at least one of the plurality of circuit elements 1220_a_ disposed in the peripheral circuit region PERI through third input/output contact plugs 1404 and 1304.

In some embodiments, the third substrate 1410 may not be disposed in a region in which the input/output contact plug is disposed. For example, as illustrated in a region 'B', the third input/output contact plug 1404 may be separated from the third substrate 1410 in a direction parallel to the top surface of the third substrate 1410 and may penetrate an interlayer insulating layer 1415 of the second cell region CELL2 so as to be connected to the third input/output pad 1406. In this case, the third input/output contact plug 1404 may be formed by at least one of various processes.

In some embodiments, as illustrated in a region 'B1', the third input/output contact plug 1404 may extend in a third direction (e.g., the Z-axis direction), and a diameter of the third input/output contact plug 1404 may become progressively greater toward the upper insulating layer 1401. In other words, a diameter of the channel structure CH described in the region 'A1' may become progressively less toward the upper insulating layer 1401, but the diameter of the third input/output contact plug 1404 may become progressively greater toward the upper insulating layer 1401. For example, the third input/output contact plug 1404 may be formed after the second cell region CELL2 and the first cell region CELL1 are bonded to each other by the bonding method.

In certain embodiments, as illustrated in a region 'B2', the third input/output contact plug 1404 may extend in the third direction (e.g., the Z-axis direction), and a diameter of the third input/output contact plug 1404 may become progressively less toward the upper insulating layer 1401. In other words, like the channel structure CH, the diameter of the third input/output contact plug 1404 may become progressively less toward the upper insulating layer 1401. For example, the third input/output contact plug 1404 may be formed together with the cell contact plugs 1440 before the second cell region CELL2 and the first cell region CELL1 are bonded to each other.

In certain embodiments, the input/output contact plug may overlap with the third substrate 1410. For example, as illustrated in a region 'C', the second input/output contact plug 1403 may penetrate the interlayer insulating layer 1415 of the second cell region CELL2 in the third direction (e.g., the Z-axis direction) and may be electrically connected to the second input/output pad 1405 through the third substrate 1410. In this case, a connection structure of the second input/output contact plug 1403 and the second input/output pad 1405 may be realized by various methods.

In some embodiments, as illustrated in a region 'C1', an opening 1408 may be formed to penetrate the third substrate 1410, and the second input/output contact plug 1403 may be connected directly to the second input/output pad 1405 through the opening 1408 formed in the third substrate 1410. In this case, as illustrated in the region 'C1', a diameter of the second input/output contact plug 1403 may become progressively greater toward the second input/output pad 1405. However, embodiments are not limited thereto, and in certain embodiments, the diameter of the second input/output contact plug 1403 may become progressively less toward the second input/output pad 1405.

In certain embodiments, as illustrated in a region 'C2', the opening 1408 penetrating the third substrate 1410 may be formed, and a contact 1407 may be formed in the opening 1408. An end of the contact 1407 may be connected to the second input/output pad 1405, and another end of the contact 1407 may be connected to the second input/output contact plug 1403. Thus, the second input/output contact plug 1403 may be electrically connected to the second input/output pad 1405 through the contact 1407 in the opening 1408. In this case, as illustrated in the region 'C2', a diameter of the contact 1407 may become progressively greater toward the second input/output pad 1405, and a diameter of the second input/output contact plug 1403 may become progressively less toward the second input/output pad 1405. For example, the second input/output contact plug 1403 may be formed together with the cell contact plugs 1440 before the second cell region CELL2 and the first cell region CELL1 are bonded to each other, and the contact 1407 may be formed after the second cell region CELL2 and the first cell region CELL1 are bonded to each other.

In certain embodiments illustrated in a region 'C3', a stopper 1409 may further be formed on a bottom end of the opening 1408 of the third substrate 1410, as compared with the embodiments of the region 'C2'. The stopper 1409 may be a metal line formed in the same layer as the common source line 1420. Alternatively, the stopper 1409 may be a metal line formed in the same layer as at least one of the word lines 1430. The second input/output contact plug 1403 may be electrically connected to the second input/output pad 1405 through the contact 1407 and the stopper 1409.

Like the second and third input/output contact plugs 1403 and 1404 of the second cell region CELL2, a diameter of each of the second and third input/output contact plugs 1303 and 1304 of the first cell region CELL1 may become progressively less toward the lower metal pattern 1371*e* or may become progressively greater toward the lower metal pattern 1371*e*.

Meanwhile, in some embodiments, a slit 1411 may be formed in the third substrate 1410. For example, the slit 1411 may be formed at a certain position of the external pad bonding region PA. For example, as illustrated in a region 'D', the slit 1411 may be located between the second input/output pad 1405 and the cell contact plugs 1440 when viewed in a plan view. Alternatively, the second input/output pad 1405 may be located between the slit 1411 and the cell contact plugs 1440 when viewed in a plan view.

In some embodiments, as illustrated in a region 'D1', the slit 1411 may be formed to penetrate the third substrate 1410. For example, the slit 1411 may be used to prevent the third substrate 1410 from being finely cracked when the opening 1408 is formed. However, embodiments are not limited thereto, and in certain embodiments, the slit 1411 may be formed to have a depth ranging from about 60% to about 70% of a thickness of the third substrate 1410.

In certain embodiments, as illustrated in a region 'D2', a conductive material 1412 may be formed in the slit 1411. For example, the conductive material 1412 may be used to discharge a leakage current occurring in driving of the circuit elements in the external pad bonding region PA to the outside. In this case, the conductive material 1412 may be connected to an external ground line.

In certain embodiments, as illustrated in a region 'D3', an insulating material 1413 may be formed in the slit 1411. For example, the insulating material 1413 may be used to electrically isolate the second input/output pad 1405 and the second input/output contact plug 1403 disposed in the external pad bonding region PA from the word line bonding region WLBA. Since the insulating material 1413 is formed in the slit 1411, it is possible to prevent a voltage provided through the second input/output pad 1405 from affecting a metal layer disposed on the third substrate 1410 in the word line bonding region WLBA.

Meanwhile, in certain embodiments, the first to third input/output pads 1205, 1405 and 1406 may be selectively formed. For example, the memory device 1500 may be realized to include only the first input/output pad 1205 disposed on the first substrate 1210, to include only the second input/output pad 1405 disposed on the third substrate 1410, or to include only the third input/output pad 1406 disposed on the upper insulating layer 1401.

In some embodiments, at least one of the second substrate 1310 of the first cell region CELL1 or the third substrate 1410 of the second cell region CELL2 may be used as a sacrificial substrate and may be completely or partially removed before or after a bonding process. An additional layer may be stacked after the removal of the substrate. For example, the second substrate 1310 of the first cell region CELL1 may be removed before or after the bonding process of the peripheral circuit region PERI and the first cell region CELL1, and then, an insulating layer covering a top surface of the common source line 1320 or a conductive layer for connection may be formed. Likewise, the third substrate 1410 of the second cell region CELL2 may be removed before or after the bonding process of the first cell region CELL1 and the second cell region CELL2, and then, the upper insulating layer 1401 covering a top surface of the common source line 1420 or a conductive layer for connection may be formed.

Figure 15:
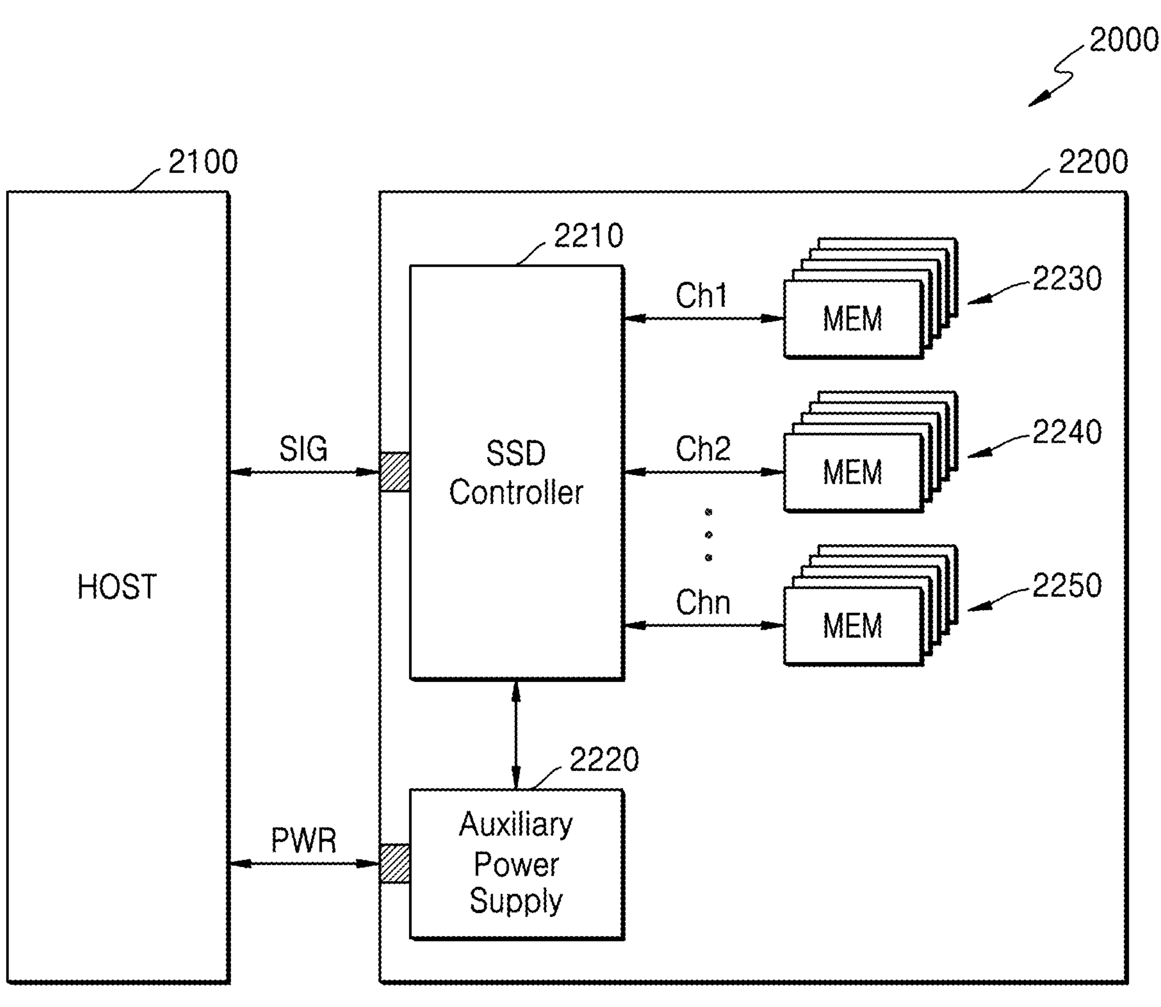
FIG. 15 is a block diagram illustrating an example in which a memory device according to embodiments is applied to a solid state drive (SSD) system.

FIG. 15 is a block diagram illustrating an example in which a memory device according to embodiments is applied to an SSD system 2000.

Referring to FIG. 15, the SSD system 2000 may include a host 2100 and an SSD 2200. The SSD 2200 may exchange signals with the host 2100 through a signal connector and receive power through a power connector. The SSD 2200 may include an SSD controller 2210, an auxiliary power supply 2220, and memory devices 2230, 2240, and 2250. The memory devices 2230, 2240, and 2250 may be vertically stacked NAND flash memory devices. In this case, the SSD controller 2210, the auxiliary power supply 2220, and the memory devices 2230, 2240, and 2250 may be implemented by using the embodiments described above with reference to FIGS. 1 to 14.

While example embodiments has been particularly shown and described, it will be understood that various changes in form and details may be made therein without departing from the spirit and scope of the following claims.

What is claimed is:

1. A memory device comprising:

a memory cell array region comprising a plurality of memory cells;

a plurality of bonding pads partially overlapping the memory cell array region in a vertical direction, the plurality of bonding pads comprising a bonding pad configured to electrically connect the memory device to an external device and a non-bonding pad configured to be electrically connected to an internal circuit of the memory device;

a first test pattern form below the bonding pad and configured to output a first test output signal based on a test input signal;

a second test pattern form below the non-bonding pad and configured to output a second test output signal based on the test input signal; and a damage detection circuit configured to output a test result signal indicating whether a lower region of the bonding pad has been damaged, based on a first number of logic level transitions of the first test output signal and a second number of logic level transitions of the second test output signal.

2. The memory device of claim 1, wherein the damage detection circuit comprises:

a first counter configured to output a first count value corresponding to transitions of the first test output signal from a high level to a low level during a first reference time period;

a second counter configured to output a second count value corresponding to transitions of the second test output signal from the high level to the low level during the first reference time period; and a comparator configured to output the test result signal based comparing the first count value with the second count value.

3. The memory device of claim 1, wherein the bonding pad is above the memory cell array region, and wherein at least a portion of the bonding pad overlaps at least a portion of the memory cell array region in a first direction that is the vertical direction.

4. The memory device of claim 1, wherein the non-bonding pad is disposed above the memory cell array region, wherein at least a portion of the non-bonding pad overlaps at least a portion of the memory cell array region in a first direction that is the vertical direction, and wherein the non-bonding pad is apart from the bonding pad in a second direction perpendicular to the first direction.

5. The memory device of claim 1, wherein the non-bonding pad is not electrically connected to the external device.

6. The memory device of claim 2, further comprising a multiplexer configured to:

select one of the second count value and a test expectation value previously input to the memory device, and provide the selected one of the second count value and the test expectation value to the comparator.

7. The memory device of claim 1, wherein the damage detection circuit is further configured to, based on a first count value indicating the first number of logic level transitions of the first test output signal is less than a first count reference value or greater than a second count reference value, output the test result signal indicating that the lower region of the bonding pad has been damaged, wherein the first count reference value is less than a second count value indicating a second number logic level transitions of the second test output signal, and wherein the second count reference value is greater than the second count value.

8. The memory device of claim 7, wherein the damage detection circuit is further configured to, based on the first count value being greater than the first count reference value and less than the second count reference value, output the test result signal indicating that the lower region of the bonding pad is normal.

9. A memory device comprising:

a memory cell array region comprising a plurality of memory cells;

a plurality of bonding pads partially overlapping the memory cell array region in a vertical direction, the plurality of bonding pads comprising a bonding pad configured to electrically connect the memory device to an external device and a non-bonding pad configured to be electrically connected to an internal circuit of the memory device;

a first test pattern form below the bonding pad and configured to output a first test output signal based on a test input signal;

a second test pattern form below the non-bonding pad and configured to output a second test output signal based on the test input signal; and a damage detection circuit configured to output a test result signal indicating whether a lower region of the bonding pad has been damaged, based on comparing a first delay time of the first test output signal with a second delay time of the second test output signal.

10. The memory device of claim 9, wherein the damage detection circuit comprises:

a first time-to-digital conversion circuit configured to output a first delay value indicating the first delay time of the first test output signal generated based on the test input signal applied during a first reference time period;

a second time-to-digital conversion circuit configured to output a second delay value indicating the second delay time of the second test output signal generated in response to the test input signal applied thereto during the first reference time period; and a comparator configured to output the test result signal based on comparing the first delay value with the second delay value.

11. The memory device of claim 9, wherein the bonding pad is above the memory cell array region, and wherein at least a portion of the bonding pad overlaps at least a portion of the memory cell array region in a first direction that is the vertical direction.

12. The memory device of claim 9, wherein the non-bonding pad is above the memory cell array region, wherein at least a portion of the non-bonding pad overlaps at least a portion of the memory cell array region in a first direction that is the vertical direction, and wherein the non-bonding pad is apart from the bonding pad in a second direction perpendicular to the first direction.

13. The memory device of claim 9, wherein the non-bonding pad is not electrically connected to the external device.

14. The memory device of claim 10, further comprising a multiplexer configured to:

select one of the second delay value and a test expectation value previously input to the memory device, and provide the selected one of the second delay value and the test expectation value to the comparator.

15. The memory device of claim 9, wherein the damage detection circuit is further configured to, based on a first delay value indicating the first delay time of the first test output signal is less than a first delay reference value or greater than a second delay reference value, output the test result signal indicating that the lower region of the bonding pad has been damaged, wherein the first delay reference value is less than a second delay value indicating the second delay time of the second test output signal, and wherein the second delay reference value is greater than the second delay value.

16. The memory device of claim 15, wherein the damage detection circuit is further configured to, based on the first delay value being greater than the first delay reference value and less than the second delay reference value, output the test result signal indicating that the lower region of the bonding pad is normal.

17. A test system comprising:

a memory device; and a test device configured to provide a test input signal to the memory device, wherein the memory device is configured to provide, to the test device, a test result signal generated based on the test input signal, and wherein the memory device comprises:

a memory cell array region comprising a plurality of memory cells;

a plurality of bonding pads partially overlapping the memory cell array region in a vertical direction, the plurality of bonding pads comprising a bonding pad configured to electrically connect the memory device to an external device and a non-bonding pad configured to be electrically connected to an internal circuit of the memory device;

a first test pattern form below the bonding pad and configured to output a first test output signal based on the test input signal;

a second test pattern form below the non-bonding pad and configured to output a second test output signal based on the test input signal; and a damage detection circuit configured to output the test result signal indicating whether a lower region of the bonding pad has been damaged, based on a first number of logic level transitions of the first test output signal and a second number of logic level transitions of the second test output signal.

18. The test system of claim 17, wherein the bonding pad is above the memory cell array region, and wherein at least a portion of the bonding pad overlaps at least a portion of the memory cell array region in a first direction that is the vertical direction.

19. The test system of claim 17, wherein the non-bonding pad is above the memory cell array region, wherein at least a portion of the non-bonding pad overlaps at least a portion of the memory cell array region in a first direction that is the vertical direction, and wherein the non-bonding pad is apart from the bonding pad in a second direction perpendicular to the first direction.

20. The test system of claim 17, wherein the non-bonding pad is not electrically connected to the external device.

* * * * *